United States Patent
Ando et al.

(10) Patent No.: US 11,915,902 B2
(45) Date of Patent: Feb. 27, 2024

(54) CONDUCTION INSPECTION METHOD FOR MULTIPOLE ABERRATION CORRECTOR, AND CONDUCTION INSPECTION APPARATUS FOR MULTIPOLE ABERRATION CORRECTOR

(71) Applicant: NuFlare Technology, Inc., Yokohama (JP)

(72) Inventors: Atsushi Ando, Edogawa-ku (JP); Kazuhiko Inoue, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 214 days.

(21) Appl. No.: 17/627,294

(22) PCT Filed: Jun. 29, 2020

(86) PCT No.: PCT/JP2020/025564
§ 371 (c)(1),
(2) Date: Jan. 14, 2022

(87) PCT Pub. No.: WO2021/010152
PCT Pub. Date: Jan. 21, 2021

(65) Prior Publication Data
US 2022/0277922 A1   Sep. 1, 2022

(30) Foreign Application Priority Data

Jul. 16, 2019   (JP) .................................. 2019-131437

(51) Int. Cl.
*H01J 37/153*   (2006.01)
*H01J 37/147*   (2006.01)
(Continued)

(52) U.S. Cl.
CPC .......... *H01J 37/153* (2013.01); *G01R 31/307* (2013.01); *H01J 37/147* (2013.01);
(Continued)

(58) Field of Classification Search
None
See application file for complete search history.

(56) References Cited

U.S. PATENT DOCUMENTS

2006/0038137 A1   2/2006   Fujii et al.
2013/0248731 A1*  9/2013   Tanimoto ................ H01J 37/10
                                                        250/396 R
(Continued)

FOREIGN PATENT DOCUMENTS

| JP | 2001-93946 A | 4/2001 |
| JP | 2006-59701 A | 3/2006 |
| JP | 2013-138037 A | 7/2013 |

OTHER PUBLICATIONS

International Search Report daed Sep. 29, 2020 in PCT/JP2020/025564 filed Jun. 29, 2020, 2 pages.
(Continued)

*Primary Examiner* — Jermele M Hollington
*Assistant Examiner* — Suresh K Rajaputra
(74) *Attorney, Agent, or Firm* — Oblon, McClelland, Maier & Neustadt, L.L.P.

(57) ABSTRACT

A conduction inspection method for a multipole aberration corrector according to one aspect of the present invention includes applying, in a state where a predetermined potential has been applied to each shield electrode, an inspection charged particle beam to pass through a first opening, a second opening, and a third opening, using a multipole aberration corrector which includes an upper-stage substrate where the first opening is formed and a shield electrode is arranged around the first opening, a middle-stage substrate where the second opening is formed, a plurality of control electrodes are disposed to be opposite each other across the second opening, and a plurality of wirings are arranged to be individually connected to one of the plurality of control
(Continued)

electrodes which are different from each other, and a lower-stage substrate where the third opening is formed and a shield electrode is arranged around the third opening, and which corrects aberration of a correction charged particle beam passing through the first opening, the second opening, and the third opening by individually variably applying a potential to each of the plurality of control electrodes; measuring, via a wiring individually connected to each control electrode of the plurality of control electrodes in the plurality of wirings, an inflow electron dose of electrons, into each control electrode of the plurality of control electrodes, which are secondarily emitted because the inspection charged particle beam has passed through the first opening, the second opening, and the third opening and has irradiated an object disposed at the downstream side of the lower-stage substrate; and determining individually, for each control electrode, whether there is conduction between a control electrode concerned and a wiring connected to the control electrode concerned, based on a result of measuring the inflow electron dose into each control electrode.

10 Claims, 17 Drawing Sheets

(51) Int. Cl.
  *H01J 37/21*   (2006.01)
  *G01R 31/307*  (2006.01)
(52) U.S. Cl.
  CPC ....... *H01J 37/21* (2013.01); *H01J 2237/1534* (2013.01); *H01J 2237/24592* (2013.01)

(56) References Cited

U.S. PATENT DOCUMENTS

2019/0066972 A1\* 2/2019 Frosien .................. H01J 37/244
2019/0355547 A1\* 11/2019 Ando ...................... H01J 37/28
2020/0395189 A1\* 12/2020 Inoue ...................... H01J 37/09

OTHER PUBLICATIONS

Korean Office Action dated Oct. 22, 2023, issued in Korean Patent Application No. 10-2022-7001118 (with English translation).

\* cited by examiner

|  | 1 | 2 | 3 | 4 | 5 | 6 | 7 | 8 |
|---|---|---|---|---|---|---|---|---|
| Beam OFF | 0.2 | -0.1 | -0.0 | 0.4 | -0.2 | -0.3 | 0.6 | -0.5 |
| Beam ON | 8.8 | 9.2 | -0.6 | 8.9 | 9.5 | 7.8 | 0.4 | 10.0 |
| Δ | 8.6 | 9.3 | -0.6 | 8.5 | 9.7 | 8.1 | 0.2 | 9.5 |
| YES/NO of Conduction Existence | Yes | Yes | No | Yes | Yes | Yes | No | Yes |

FIG.8

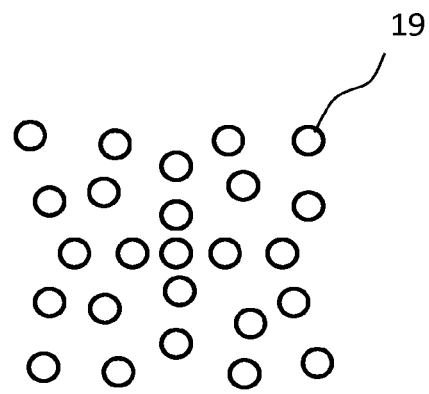
FIG.13A
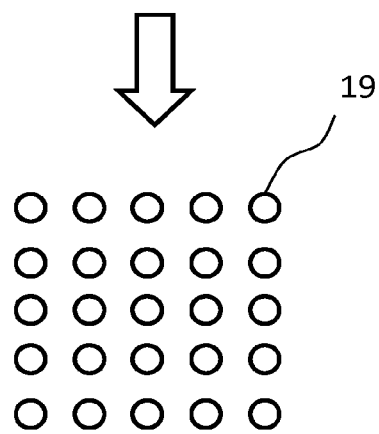
FIG.13B
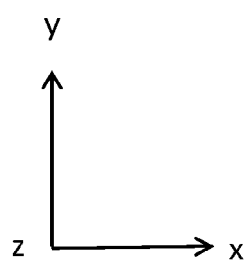

CONDUCTION INSPECTION METHOD FOR MULTIPOLE ABERRATION CORRECTOR, AND CONDUCTION INSPECTION APPARATUS FOR MULTIPOLE ABERRATION CORRECTOR

TECHNICAL FIELD

This application is based upon and claims the benefit of priority from Japanese Patent Application No. 2019-131437 filed on Jul. 16, 2019 in Japan, the contents of which are incorporated herein.

The present invention relates to a conduction inspection method for a multipole aberration corrector, and a conduction inspection apparatus for a multipole aberration corrector, and for example, to a conduction inspection method for a multipole aberration corrector, which corrects aberration of multiple beams, installed in an apparatus that applies electron multiple beams.

BACKGROUND ART

With recent progress in high integration and large capacity of the Large Scale Integrated circuits (LSI), the circuit line width required for semiconductor elements is becoming increasingly narrower. Since LSI manufacturing requires an enormous production cost, it is essential to improve the yield. However, as typified by 1 gigabit DRAMs (Random Access Memories), patterns which make up LSI are reduced from the order of submicrons to nanometers. Also, in recent years, with miniaturization of dimensions of LSI patterns formed on a semiconductor wafer, dimensions to be detected as a pattern defect have become extremely small. Therefore, the pattern inspection apparatus for inspecting defects of ultrafine patterns exposed/transferred onto a semiconductor wafer needs to be highly accurate.

As an inspection method, there is known a method of comparing a measured image acquired by imaging a pattern formed on a substrate, such as a semiconductor wafer or a lithography mask, with design data or with another measured image acquired by imaging the identical pattern on the substrate. For example, as a pattern inspection method, there are "die-to-die inspection" and "die-to-database inspection". The "die-to-die inspection" method compares data of measured images acquired by imaging identical patterns at different positions on the same substrate. The "die-to-database inspection" method generates, based on pattern design data, design image data (reference image), and compares it with a measured image being measured data acquired by imaging a pattern. Acquired images are transmitted as measured data to a comparison circuit. After performing alignment between the images, the comparison circuit compares the measured data with reference data according to an appropriate algorithm, and determines that there is a pattern defect if the compared data do not match each other.

With respect to the pattern inspection apparatus described above, in addition to the apparatus that irradiates an inspection substrate with laser beams in order to obtain a transmission image or a reflection image, there has been developed another inspection apparatus that acquires a pattern image by scanning the inspection substrate with electron beams and detecting secondary electrons emitted from the inspection substrate due to the irradiation with the electron beams. With regards to the inspection apparatuses using electron beams, further, those using multiple beams have also been under development. In an electron optical system using multiple beams, aberration such as off-axis astigmatism and distortion (distortion aberration) may occur. With the inspection apparatus using electron beams, it is necessary to acquire a highly accurate image in order to perform inspection. In order to correct such an aberration, the trajectory of each of the multiple beams needs to be individually corrected. For example, for the correction, there is a method of arranging in an array multipole lenses each of which is for each beam. In the aberration corrector, the areas of openings of the multipole lenses through which respective beams pass are small, and shield substrates are arranged above and below the substrate where the multipole lenses are disposed. Therefore, in performing a conduction inspection of the wiring which connects respective poles of the multipole lenses, since the probe cannot enter the opening, it cannot contact each pole. Accordingly, there has been a problem that it is impossible to perform a conduction inspection on each pole. Therefore, the conduction inspection cannot be performed before installing the aberration corrector in the inspection apparatus, and thus, after installing it in the inspection apparatus, the operation of each pole of the multipole lenses is checked by actually inspecting aberration of the multiple beams. Consequently, if a defective pole mixedly exists in the poles of the multipole lenses each for each of the multiple beams, it becomes necessary to exchange the aberration corrector after it was installed in the inspection apparatus.

Although not being the structure where multipole lenses which individually correct the trajectory of each beam are arranged in an array, there is disclosed an aberration corrector that corrects an off-axis astigmatism by making all of the multiple beams pass through a space surrounded by multipoles (e.g., refer to Patent Literature 1).

CITATION LIST

Patent Literature

Patent Literature 1: JP-A-2013-138037

SUMMARY OF INVENTION

Technical Problem

One aspect of the present invention provides an inspection method and inspection apparatus that can perform a conduction inspection of a multipole aberration corrector even when the opening between multiple poles is small.

Solution to Problem

According to one aspect of the present invention, a conduction inspection method for a multipole aberration corrector includes
applying, in a state where a predetermined potential has been applied to each shield electrode, an inspection charged particle beam to pass through a first opening, a second opening, and a third opening, using a multipole aberration corrector which includes an upper-stage substrate where the first opening is formed and a shield electrode is arranged around the first opening, a middle-stage substrate where the second opening is formed, a plurality of control electrodes are disposed to be opposite each other across the second opening, and a plurality of wirings are arranged to be individually connected to one of the plurality of control electrodes which are different from each other, and a lower-stage substrate where the third opening is formed and a shield electrode is arranged around the third opening, and which corrects aberration of a correction charged particle beam passing through the first opening, the second opening, and the third opening by individually variably applying a potential to each of the plurality of control electrodes;

measuring, via a wiring individually connected to each control electrode of the plurality of control electrodes in the plurality of wirings, an inflow electron dose of electrons, into the each control electrode of the plurality of control electrodes, which are secondarily emitted because the inspection charged particle beam has passed through the first opening, the second opening, and the third opening and has irradiated an object disposed at a downstream side of the lower-stage substrate; and determining individually, for the each control electrode, whether there is conduction between a control electrode concerned and a wiring connected to the control electrode concerned, based on a result of measuring the inflow electron dose into the each control electrode.

According to another aspect of the present invention, a conduction inspection apparatus for a multipole aberration corrector includes an emission source configured to emit an inspection charged particle beam;

a focusing mechanism configured to control a focus position of the inspection charged particle beam;

a deflector configured to deflect the inspection charged particle beam in order to control an irradiation position of the inspection charged particle beam;

a stage on which there are disposed
  a multipole aberration corrector which includes an upper-stage substrate where a first opening is formed and a shield electrode is arranged around the first opening, a middle-stage substrate where a second opening is formed, a plurality of control electrodes are disposed to be opposite each other across the second opening, and a plurality of wirings are arranged to be individually connected to one of the plurality of control electrodes which are different from each other, and a lower-stage substrate where a third opening is formed and a shield electrode is arranged around the third opening, and which corrects aberration of a correction charged particle beam passing through the first opening, the second opening, and the third opening by individually variably applying a potential to each of the plurality of control electrodes, and
  an object disposed at a downstream side of the lower-stage substrate and irradiated with the inspection charged particle beam having passed through the first opening, the second opening, and the third opening, and at least one inflow electron dosimeter connected to the plurality of wirings, wherein it is determined individually, for each control electrode, whether there is conduction between a control electrode concerned and a wiring connected to the control electrode concerned, based on a result of measuring by the at least one inflow electron dosimeter, via a wiring individually connected to the each control electrode in the plurality of wirings, an inflow electron dose of an electron, into the each control electrode of the plurality of control electrodes, which is secondarily emitted because the inspection charged particle beam has passed through the first opening, the second opening, and the third opening and has irradiated an object disposed at a downstream side of the lower-stage substrate.

Advantageous Effects of Invention

According to one aspect of the present invention, even when the opening between multiple poles is small, a conduction inspection can be performed for a multipole aberration corrector. Thus, it is possible to perform a conduction inspection of a multipole aberration corrector before installing it in a multiple beam irradiation apparatus, such as an inspection apparatus, for which an aberration correction is to be needed.

BRIEF DESCRIPTION OF DRAWINGS

FIG. 8 is a table showing an example of a result of a conduction inspection according to the embodiment 1.

FIGS. 13A and 13B show an example of a distortion aberration (distortion) according to the embodiment 1.

DESCRIPTION OF EMBODIMENTS

Embodiments below describe a case in which an electron beam is used as a charged particle beam. However, it is not limited thereto. It may be the case where an ion beam, for example, is used as the charged particle beam.

Embodiment 1

Figure 1:
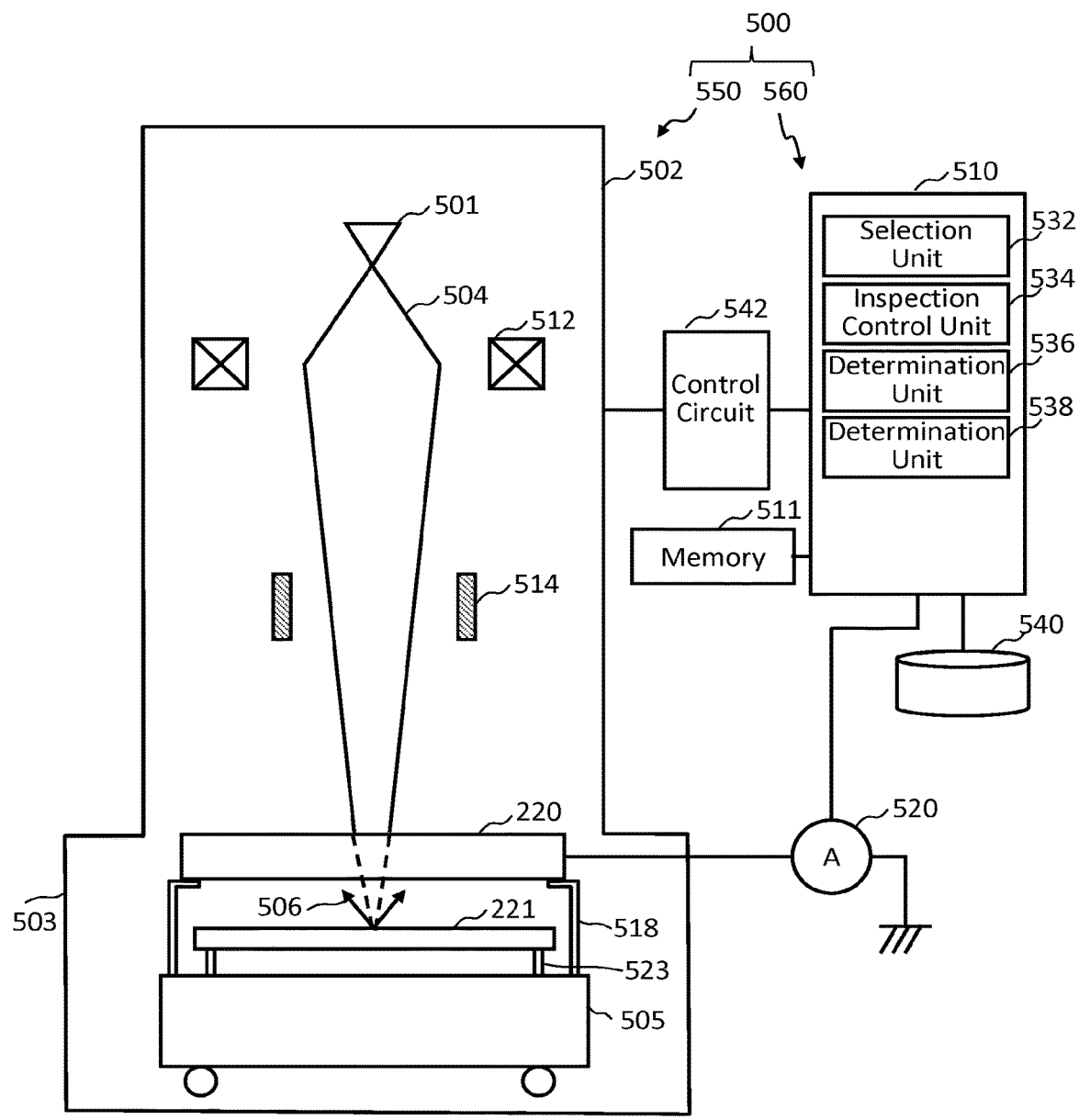
FIG. 1 shows an example of a configuration of a conduction inspection apparatus for a multipole aberration corrector according to an embodiment 1.

FIG. 1 shows an example of a configuration of a conduction inspection apparatus for a multipole aberration corrector according to an embodiment 1. In FIG. 1, a conduction inspection apparatus 500 performs a conduction inspection of a multipole aberration corrector 220. The conduction inspection apparatus 500 includes an inspection mechanism 550, a control system circuit 560, and at least one inflow electron dosimeter 520. The inspection mechanism 550 includes an electron beam column 502 (electron optical column) and an inspection chamber 503. In the electron beam column 502, there are disposed an electron gun 501, an electromagnetic lens 512, and a deflector 514.

In the inspection chamber 503, a stage 505 movable at least in the x and y directions is disposed. On the stage 505, the multipole aberration corrector 220 is disposed via a plurality of support tables 518. Further, on the stage 505, a reflector 221 is disposed via a plurality of support pins 523. The reflector 221 is arranged with a space below the multipole aberration corrector 220. Therefore, the supporting surfaces of the plurality of support tables 518 are arranged upper than those of the plurality of support pins 523. For example, the plurality of support tables 518 are preferably disposed outside the outer periphery of the reflector 221 to surround it.

Alternatively, it is also preferable to configure that the reflector 221 is arranged at the position of the trajectory central axis (optical axis) of an electron beam 504, and the stage 505 is moved such that, without moving the reflector 221, the multipole aberration corrector 220 relatively moves in the x and y directions to the reflector 221.

Further, as will be described later, a plurality of openings through which multiple beams pass are formed in the multipole aberration corrector 220, and a multipole of, for example, eight poles are arranged around each opening. Then, at least one inflow electron dosimeter 520 measures an inflow electron dose with respect to the eight poles. For example, one inflow electron dosimeter 520 may measure the inflow electron dose, in order, with respect to all of the poles. Alternatively, the inflow electron dosimeters 520, whose number is the same as that of poles of the multipole, may be arranged. Alternatively, the inflow electron dosimeters 520, whose number is the same as that of all the poles of the plurality of multipoles, may be arranged. As the inflow electron dosimeter 520, an ammeter is used, for example. Measured value data measured by the inflow electron dosimeter 520 is output to the control computer 510.

The control system circuit 560 includes a control computer 510, a memory 511, a storage device 540, such as a magnetic disc, and a control circuit 542. The control computer 510, the memory 511, the storage device 540, and the control circuit 542 are connected to each other through a bus (not shown).

In the control computer 510, there are arranged a selection unit 532, an inspection control unit 534, a determination unit 536, and a determination unit 538. Each of the "units" such as the selection unit 532, the inspection control unit 534, the determination unit 536, and the determination unit 538 includes processing circuitry. The processing circuitry includes, for example, an electric circuit, a computer, a processor, a circuit board, a quantum circuit, or a semiconductor device. Each " . . . unit" may use common processing circuitry (the same processing circuitry), or different processing circuitry (separate processing circuitry). Information input/output to/from the selection unit 532, the inspection control unit 534, the determination unit 536, and the determination unit 538, and information being operated are stored in the memory 511 each time.

Figure 2:
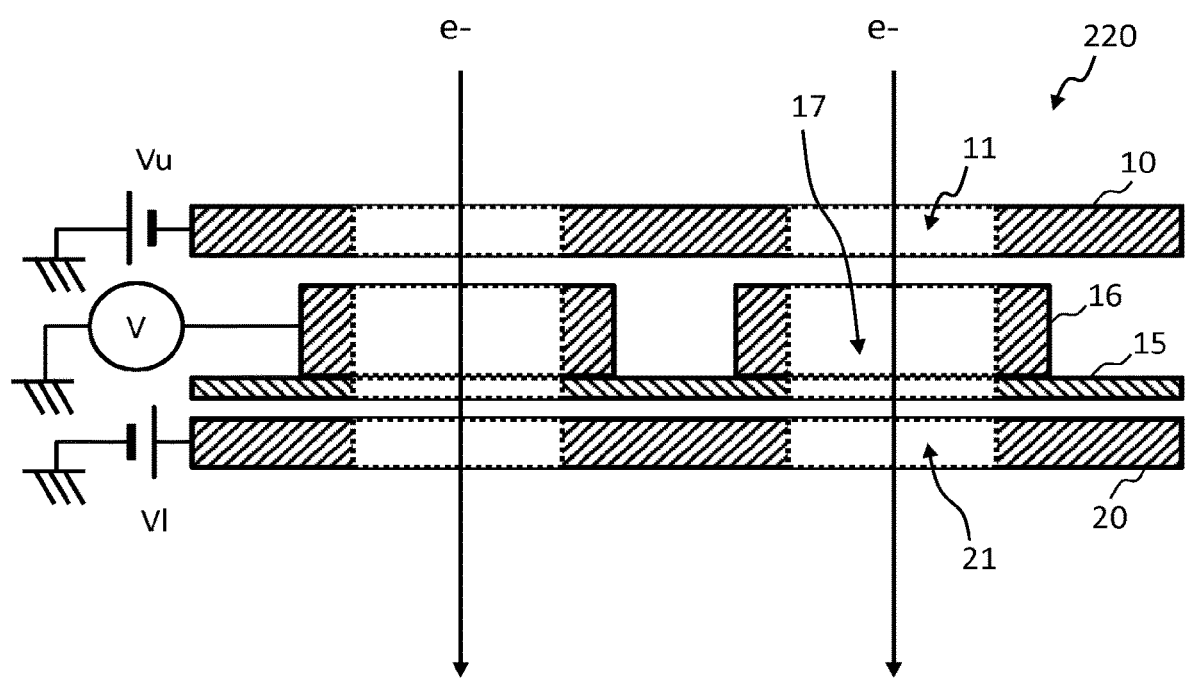
FIG. 2 is a sectional view showing an example of a configuration of a multipole aberration corrector according to the embodiment 1.
Figure 3A:
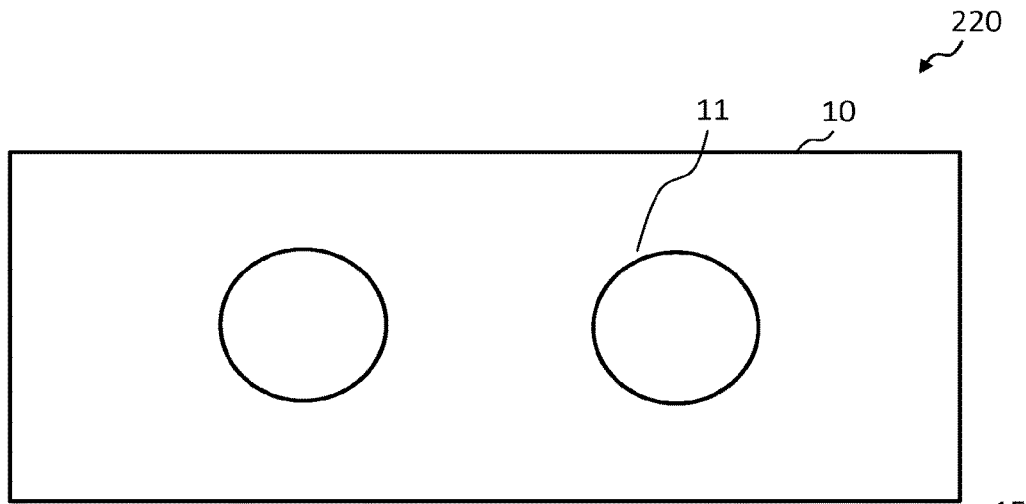
FIGS. 3A to 3C are a top view showing an example of a configuration of each stage of a multipole aberration corrector according to the embodiment 1.
Figure 3B:
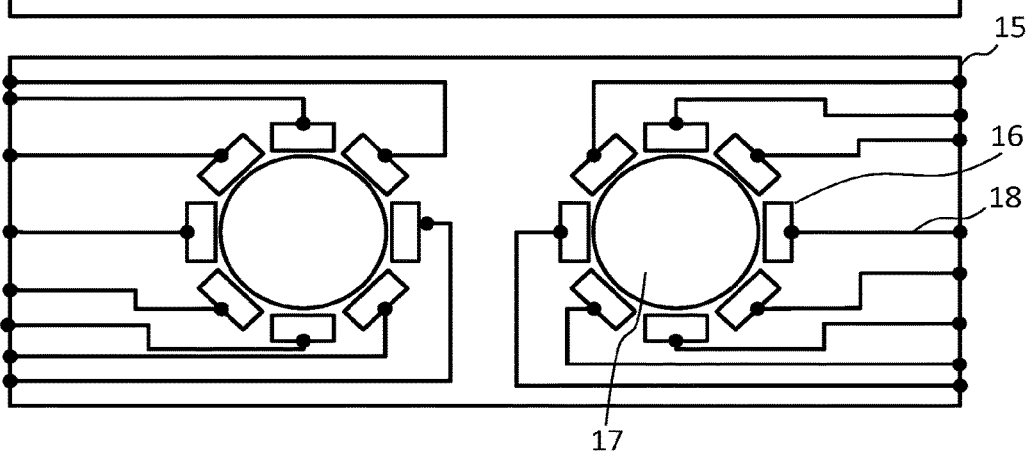
Figure 3C:
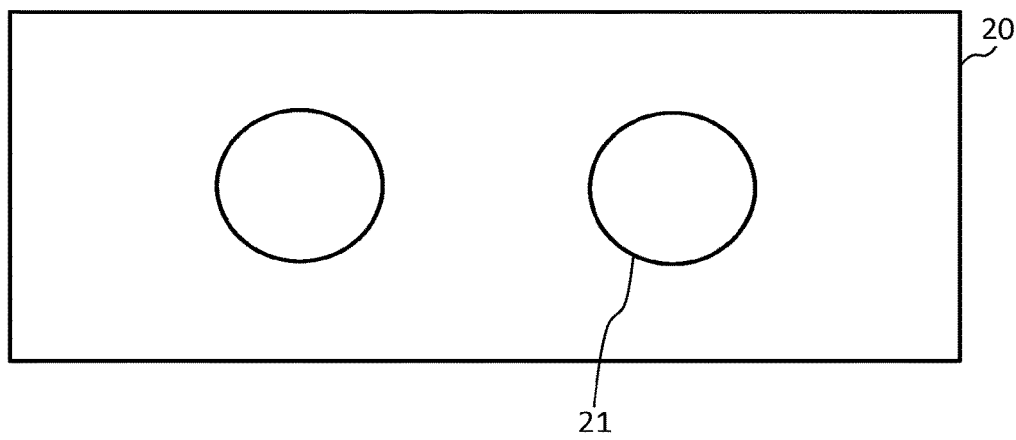

FIG. 2 is a sectional view showing an example of a configuration of the multipole aberration corrector 220 according to the embodiment 1. FIG. 3 (FIGS. 3A to 3C) are top views each showing an example of a configuration of each stage of the multipole aberration corrector 220 according to the embodiment 1. In FIG. 2 and FIGS. 3A to 3C, the multipole aberration corrector 220 is formed by a combination of three stage substrates, for example. As shown in FIG. 3A, in an upper-stage substrate 10 of the three stage substrates, at least one opening 11 (first opening) is formed. Then, a shield electrode is arranged around the at least one opening 11. In the cases of FIG. 2 and FIG. 3A, the whole outer surface of the upper-stage substrate 10 including the inner wall of the opening 11, made from silicon (Si), for example, is coated with conductive material. Therefore, the coated thin film serves as a shield electrode. Alternatively, it is also preferable to make the upper-stage substrate 10 itself with metal material. When the upper-stage substrate 10 itself is made of metal material, the upper-stage substrate 10 itself serves as a shield electrode. FIG. 2 and FIG. 3A show the case where two openings 11 are formed, for example.

As shown in FIG. 3B, in a middle-stage substrate 15 of the three stage substrates, at least one opening 17 (second opening) is formed. For each opening 17 of the at least one opening 17, a plurality of control electrodes 16, being opposite each other across the opening 17 concerned, are disposed on the middle-stage substrate 15. The plurality of control electrodes 16 should be two or more poles. In the cases of FIG. 2 and FIG. 3B, as the plurality of control electrodes 16, eight poles (multipole) are disposed to surround the opening 17. For example, the total eight poles is composed of two poles facing each other in the x direction, two poles facing each other in the y direction, two poles facing each other in the direction inclined by 45 degrees from the x axis to the y axis, and two poles facing each other in the direction inclined by 135 degrees from the x axis to the y axis centering on the center of the opening 17. Then, a plurality of wirings 18 are individually connected to one of the plurality of control electrodes 16 which are different from each other. Each wiring 18 is pulled around on the silicon (Si) middle-stage substrate 15 where an insulating film is formed on the surface, for example. One end of each wiring 18 is connected to the corresponding control electrode 16, and the other end is connected to a terminal (pads) (not shown) arranged, for each electrode, at the peripheral edge of the middle-stage substrate 15. FIG. 2 and FIG. 3B show the case where two openings 17 are formed, for example.

As shown in FIG. 3C, in a lower-stage substrate 20 of the three stage substrates, at least one opening 21 (third opening) is formed. Then, a shield electrode is arranged around the at least one opening 21. In the cases of FIG. 2 and FIG. 3C, the whole outer surface of the lower-stage substrate 20 including the inner wall of the opening 21, made from silicon (Si), for example, is coated with conductive material. Therefore, the coated thin film serves as a shield electrode. Alternatively, it is also preferable to make the lower-stage substrate 20 itself with metal material. When the lower-stage substrate 20 itself is made of metal material, the lower-stage substrate 20 itself serves as a shield electrode. FIG. 2 and FIG. 3C show the case where two openings 21 are formed, for example.

The numbers of the opening 11, the opening 17, and the opening 21 are the same. The position of each of them is correspondingly the same. In other words, the openings 11, 17, and 21, each number of which is the same as that of charged particle beams whose aberrations are to be corrected by the multipole aberration corrector 220, are individually formed at the position where each beam to be corrected passes. When the multipole aberration corrector 220 is used, a ground (GND) potential (predetermined electric potential), for example, is applied to the shield electrode of the upper-stage substrate 10. Similarly, a GND potential (predetermined electric potential), for example, is applied to the shield electrode of the lower-stage substrate 20. On the other hand, an electric potential that varies according to the magnitude of aberration of a charged particle beam to be corrected is individually applied to each control electrode 16 of the middle-stage substrate 15. The electric potential applied to the shield electrode is not limited to the GND potential. For example, a negative voltage Vu(0V≥Vu>−50V) which pushes electrons back and includes a GND potential is applied to the shield electrode of the upper-stage substrate 10. For example, a positive voltage V1(0V≤=V1<2V) which includes a GND potential is applied to the shield electrode of the lower-stage substrate 20.

Figure 4:
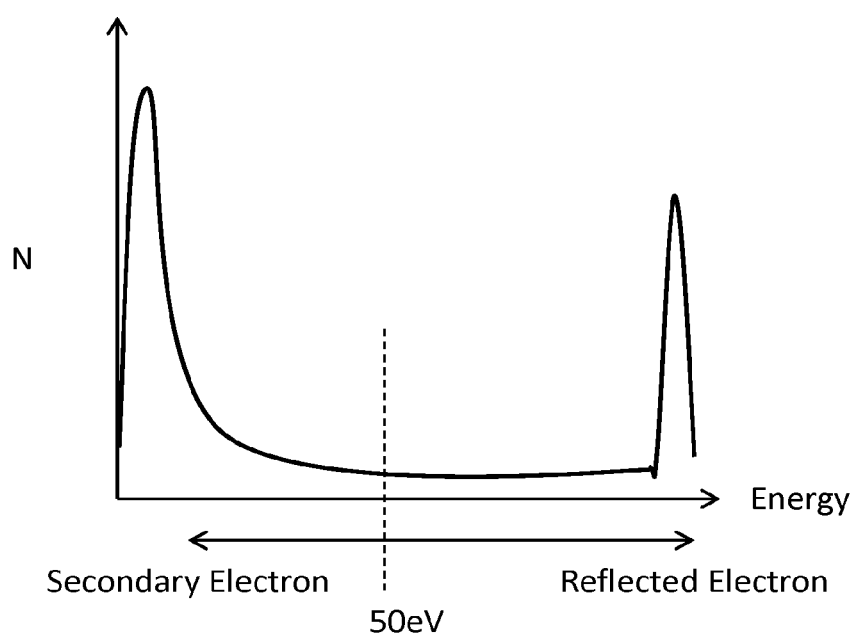
FIG. 4 illustrates an energy distribution of a secondary electron and a reflected electron according to the embodiment 1.

FIG. 4 illustrates an energy distribution of a secondary electron and a reflected electron according to the embodiment 1. Electrons are secondarily generated by an electron which entered a solid object. In FIG. 4, generally, it is roughly classified into a secondary electron of 50 eV or less and a reflected electron having a close incident electron energy. It is known that secondary electrons emitted from various substances have their peaks close to 2 eV. According to the embodiment 1, in order to accelerate, to the middle-stage substrate 15 side, electrons generated secondarily from the reflector 221 with respect to an incident electron, a positive potential V1 is applied to the shield electrode of the lower-stage substrate 20. On the other hand, it is preferable that, in order to suppress especially secondary electrons that pass through the middle-stage substrate 15, a negative voltage Vu(0V≥Vu>−50V) which pushes electrons back and includes a GND potential is applied to the shield electrode of the upper-stage substrate 10, for example.

Figure 5:
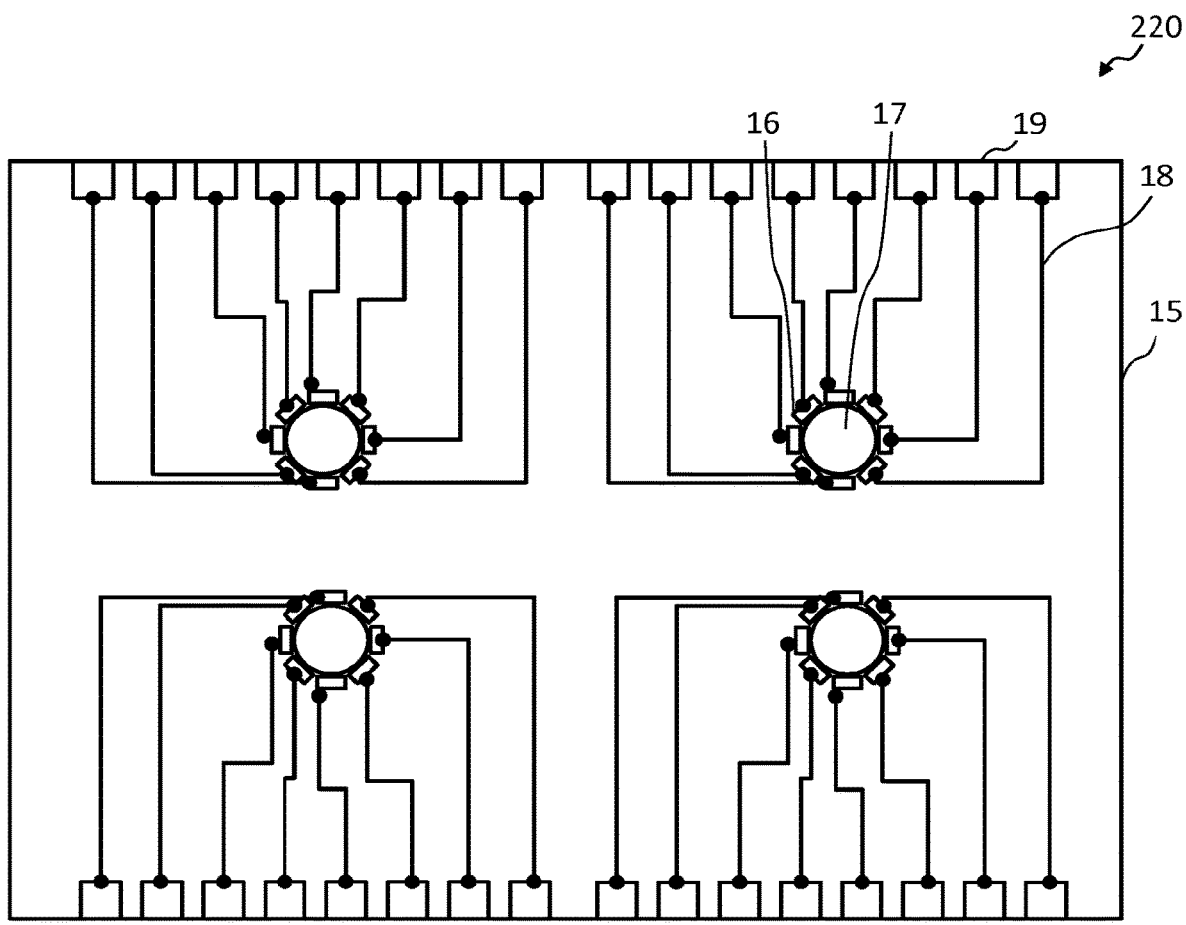
FIG. 5 is a top view showing another example of a configuration of the middle-stage substrate of a multipole aberration corrector according to the embodiment 1.

FIG. 5 is a top view showing another example of the configuration of the middle-stage substrate of the multipole aberration corrector according to the embodiment 1. In the case of FIG. 5, four openings 17 are formed in the middle-stage substrate 15 of the multipole aberration corrector 220. Around each of the openings 17, eight control electrodes 16, for example, are disposed to surround it. To each of the control electrodes 16 of each opening 17, one end of the wiring 18 is connected, and the other end of it is connected to a terminal 19 (pads) which is arranged, for each electrode, at the outer peripheral portion of the middle-stage substrate 15. Then, for performing a quality inspection of items of the multipole aberration corrector 220, it goes without saying that conduction needs to be ensured between each control electrode 16 and each terminal 19. In other words, it is necessary that there is no disconnection of each wiring 18, or no short-circuiting (short circuit) with other wiring. Therefore, with respect to each group of the control electrode 16, the wiring 18, and the terminal 19 (pads) (the other end of wiring), a conduction inspection needs to be performed between the control electrode 16 and the terminal 19 (the other end of wiring).

In order to inspect conduction between each control electrode 16 and each terminal 19 of the middle-stage substrate 15 of the multipole aberration corrector 220, it is necessary for each control electrode 16 and each terminal 19 (pads) of the middle-stage substrate 15 to be individually contacted by a probe (exploring needle). The probe can contact, from the outside of the multipole aberration corrector 220, each terminal 19 (pads) arranged at the outer peripheral portion of the middle-stage substrate 15. However, there has been a problem that since the diameter size of each of the openings 11, 17, and 21 is as small as, for example, around φ100 μm, the probe cannot reach each control electrode 16 of the middle-stage substrate 15 through the opening 11 of the upper-stage substrate 10. Therefore, it is difficult to perform a conduction inspection. Then, according to the embodiment 1, the conduction inspection is carried out without connecting a probe, etc. to each control electrode 16 of the middle-stage substrate 15. It will be specifically described below.

Figure 6:
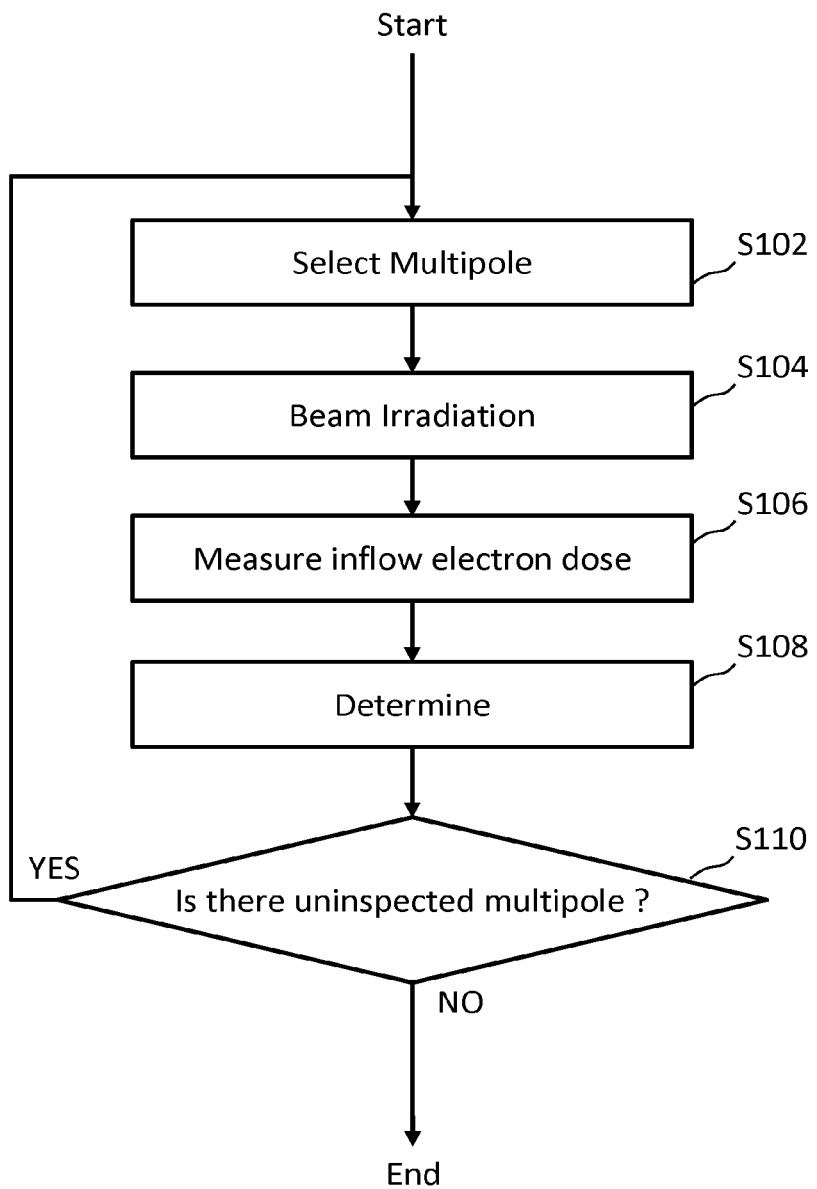
FIG. 6 is a flowchart showing main steps of an example of a conduction inspection method for a multipole aberration corrector according to the embodiment 1.

FIG. 6 is a flowchart showing main steps of an example of a conduction inspection method for the multipole aberration corrector 200 according to the embodiment 1. In FIG. 6, the conduction inspection method for the multipole aberration corrector 200 of the embodiment 1 executes a series of steps: a multipole selection step (S102), a beam irradiation step (S104), an inflow electron dosimetry step (S106), a determination step (S108), and a determination step (S110).

First, on the stage 505 of the conduction inspection apparatus 500, the reflector 221 is disposed via the plurality of support pins 523. Then, the multipole aberration corrector 220 is disposed, with the upper-stage substrate 10 side facing upward, on the stage 505 via the plurality of support tables 518. To each terminal 19 (pads) of the middle-stage substrate 15, a wiring or a probe is connected. The wiring (including wiring of the probe) is pulled out of the inspection chamber 503. The shield electrode of the upper-stage substrate 10 and that of the lower-stage substrate 20 are individually grounded.

In the multipole selection step (S102), the selection unit 532 selects one multipole from at least one multipole. In other words, one opening 17 is selected from at least one opening 17. In the example of FIG. 5, one opening 17 is selected from the four openings 17.

Figure 7:
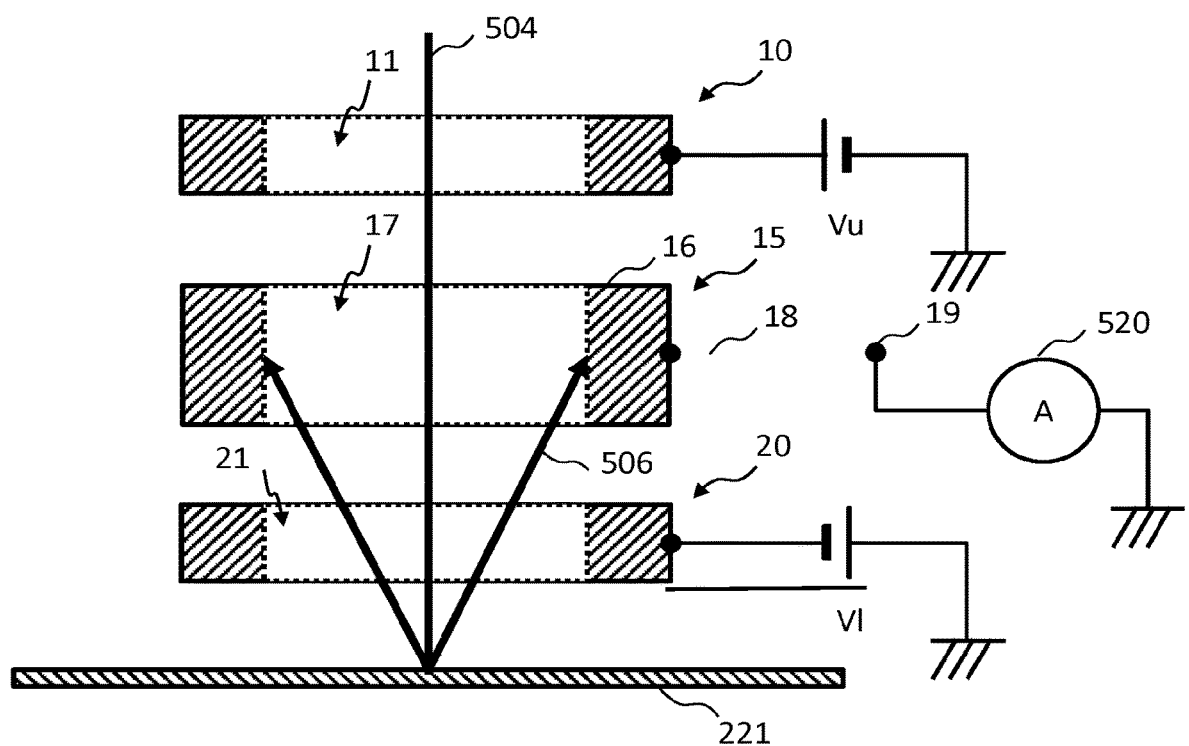
FIG. 7 illustrates a conduction inspection method according to the embodiment 1.

FIG. 7 illustrates a conduction inspection method according to the embodiment 1. FIG. 7 shows, for the sake of convenience, two control electrodes 16 which are opposite each other across the opening 17 of the selected multipole, the opening 11 of the upper-stage substrate 10 above the opening 17 around which the selected multipole is arranged, and the opening 21 of the lower-stage substrate 20 below the opening 17. Further, the reflector 221 is arranged below the multipole aberration corrector 220. One control electrode 16 of the selected multipole (e.g., eight control electrodes 16) is connected to one terminal of the inflow electron dosimeter 520 via the wiring 18 and the terminal 19. The other terminal of the inflow electron dosimeter 520 is grounded. Further, the shield electrode of the upper-stage substrate 10 and that of the lower-stage substrate 20 are individually grounded. It is effectively preferable that eight wirings connected to the eight terminals 19 (pads), which are associated with the selected multipole (e.g., eight control electrodes 16) or with the multipole (e.g., eight control electrodes 16) surrounding the selected opening 17, are individually connected to one terminal of one of different eight inflow electron dosimeters 520. At this time, the other terminal of the eight inflow electron dosimeters 520 is grounded.

In the example described below, every time the multipole is selected, eight wirings connected to the eight terminals 19

(pads), which are associated with the selected multipole (e.g., eight control electrodes 16), may be individually connected to one terminal of one of different eight inflow electron dosimeters 520, but it is not limited thereto. The inflow electron dosimeters 520, the number of which is obtained by multiplying the number of the openings 17 by the number of poles (the number of electrodes) of the multipole, may be disposed in advance. Then, it is also preferable that the terminals 19 (pads) for all the control electrodes 16 are individually connected to one terminal of the inflow electron dosimeters 520 regardless of selection of the multipole. Thereby, it becomes unnecessary to rewire at each selection of the multipole.

In the beam irradiation step (S104), the control circuit 542 controlled by the inspection control unit 534 controls the inspection mechanism 550, as shown in FIG. 7, to deliver the electron beam 504 for inspection to pass through each of the openings 11, 17, and 21 at the position of the selected multipole of the multipole aberration corrector 220 in a state where a ground potential is applied to each shield electrode of the upper-stage substrate 10 and the lower-stage substrate 20. Specifically, the irradiation position of the inspection electron beam 504 emitted from the electron gun 501 (emission source) is controlled to pass through, by the deflector 514, each of the openings 11, 17, and 21 at the position of the selected multipole, and to deliver irradiation to the reflector 221, while being focused on the reflector 221 by the electromagnetic lens 512 (focusing mechanism). Since the size of the electron beam is sufficiently smaller than the opening size of each of the openings 11, 17, and 21, the inspection electron beam 504 can pass through each of them. If the surface of the reflector 221 is irradiated with the inspection electron beam 504, thereby, an electron 506 is secondarily emitted from the reflector 221. For example, a reflected electron or/and a secondary electron is emitted. A portion of the secondary electron 506, such as the emitted reflected electron or/and secondary electron, passes through the opening 21 and collides with the control electrode 16 arranged around the opening 17. In other words, an electron beam flows into the control electrode 16.

In the inflow electron dosimetry step (S106), at least one inflow electron dosimeter 520 measures an inflow electron dose of the electrons 506, which are secondarily emitted because the inspection electron beam 504 has passed through each of the openings 11, 17, and 21, and has irradiated the reflector 221 (object), into each of the plurality of control electrodes 16, via the wiring 18 individually connected to each control electrode 16 in the plurality of wirings 18. As the inflow electron dose, it is preferable to use a current value, for example. Alternatively, it is also preferable to arrange a resistance in series between one terminal and the other terminal of the inflow electron dosimeter 520, measure an electric potential difference (voltage) between the both ends of the resistance, and use the potential difference (voltage) as the inflow electron dose.

In the determination step (S108), using the result of measuring the inflow electron dose into each control electrode 16, the determination unit 536 individually determines, for each control electrode 16, whether there is conduction between the control electrode 16 concerned and the wiring 18 connected to the control electrode 16 concerned. Specifically, it is individually determined whether there is conduction between the control electrode 16 concerned to which one end of the wiring 18 is connected, and the terminal 19 (pad) at the other end of the wiring 18.

FIG. 8 is a table showing an example of a result of a conduction inspection according to the embodiment 1. The example of FIG. 8 shows a multipole of eight poles, and the numbers of the control electrodes 16 are 1 to 8. The example of FIG. 8 shows, for each control electrode 16, a current value in a state (beam OFF) before applying the inspection electron beam 504, where the values of −0.5 to 0.6 pA are shown. Further, the example of FIG. 8 shows, for each control electrode 16, a current value in a state (beam ON) after applying the inspection electron beam 504, where values of −0.6 to 10.0 pA are shown. The determination unit 536 calculates, for each control electrode 16, a difference by subtracting a current value before delivering irradiation from a current value during irradiation of the inspection electron beam 504, and if the difference is not greater than or equal to a threshold, it is determined to be disconnection. In the case of FIG. 8, 8 pA is used as the threshold, for example. In the case of FIG. 8, since the difference with respect to the third control electrode is −0.6 pA, and that with respect to the seventh control electrode is 0.2 pA, which are not greater than or equal to 8 pA, it is determined that there is no conduction (disconnection or defective conduction). Differences with respect to the remaining control electrodes are all equal to or greater than the threshold of 8 pA, and therefore, it is determined that there is conduction.

In the determination step (S110), the determination unit 538 determines whether there is an uninspected multipole or not. If an uninspected multipole remains, it returns to the multipole selection step (S102) and repeats each step from the multipole selection step (S102) to the determination step (S108) until an uninspected multipole does not exist.

Regarding the electron 506 secondarily emitted in the beam irradiation step (S104), it does not necessarily go toward the target control electrode 16. Therefore, depending on the irradiation position, there may be variability among measurement results with respect to the control electrodes 16 of the multipole. Then, when applying irradiation of the inspection electron beam 504, it is preferable to scan the reflector 221 with the inspection electron beam 504 when the deflector 514 deflects the inspection electron beam 504. Preferably, the scanning direction is along the arrangement direction of each control electrode 16. Thereby, the variability among the measurement results of the control electrodes 16 can be reduced or eliminated.

Figure 9:
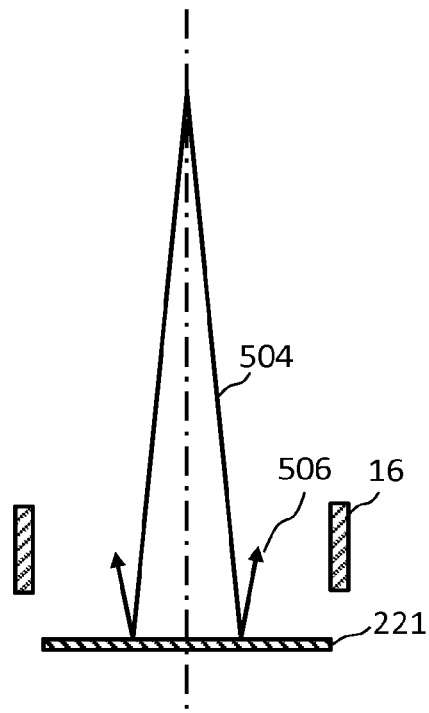
FIG. 9 shows an example of the shape of the surface of a reflector according to the embodiment 1.

FIG. 9 shows an example of the shape of the surface of a reflector according to the embodiment 1. The example of FIG. 9 shows the case where the surface of the reflector 221 is substantially a plane.

Figure 10:
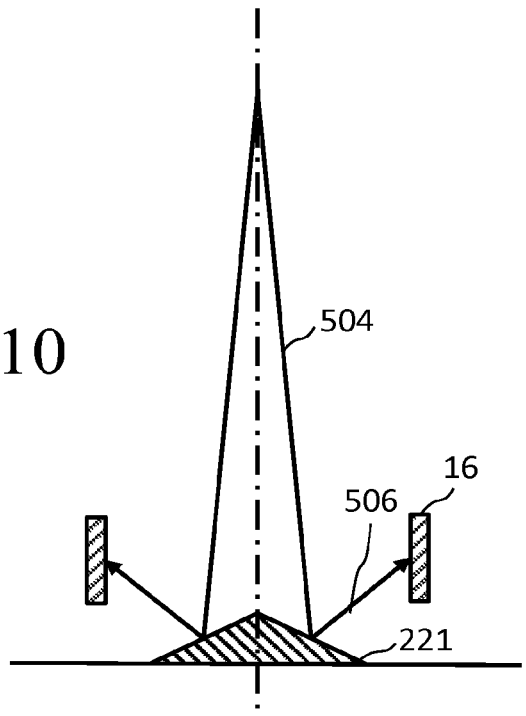
FIG. 10 shows another example of the shape of the surface of a reflector according to the embodiment 1.

FIG. 10 shows another example of the shape of the surface of the reflector according to the embodiment 1. The example of FIG. 10 shows the case where a convex portion of a cone is formed, centering on the center of the opening, in the surface of the reflector 221. When the plane shown in the example of FIG. 9 is scanned with the inspection electron beam 504, the electrons 506 emitted secondarily are apt to be emitted orthogonally to the plane. Therefore, the electron amount going toward the control electrodes 16 tends to be small. On the other hand, with respect to the conical shape shown in the example of FIG. 10, when the reflector 221 is scanned with the inspection electron beam 504, since the inspection electron beam 504 collides with the slant face of the convex portion of the cone, the electrons 506 emitted secondarily are apt to be emitted diagonally. Therefore, the electron amount going toward the control electrodes 16 can be increased, thereby being preferable.

Next, a usage example of the multipole aberration corrector 220 to be a target of conduction inspection will be described. Hereinafter, the embodiment 1 describes the case where the multipole aberration corrector 220 is mounted on a pattern inspection apparatus using multiple electron beams. However, it is not limited thereto. The multipole aberration corrector 220 may be mounted on an irradiation apparatus which applies electron beams and for which aberration needs to be corrected.

Figure 11:
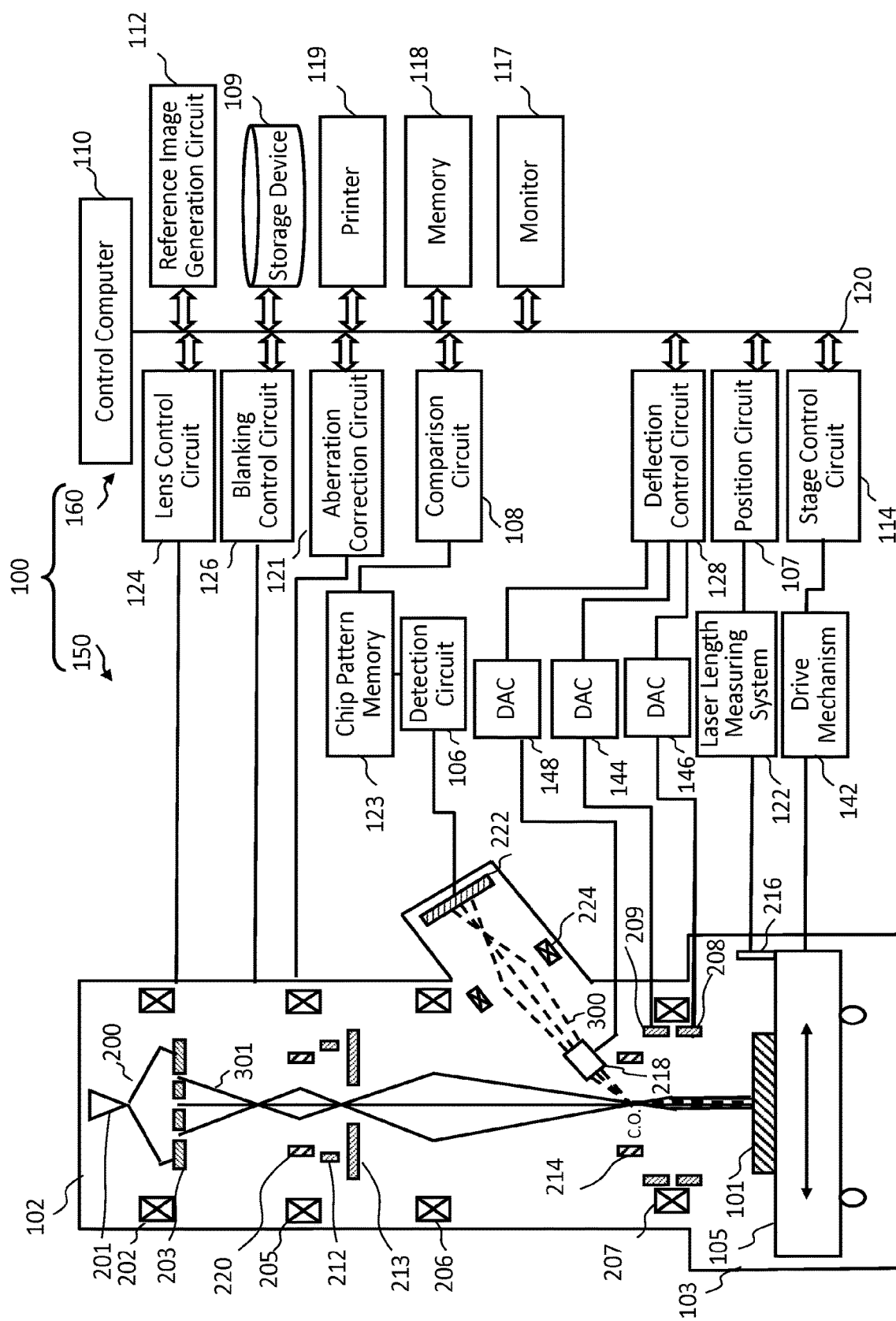
FIG. 11 is a block diagram showing a configuration of a pattern inspection apparatus according to the embodiment 1.

FIG. 11 shows an example of a configuration of a pattern inspection apparatus according to the embodiment 1. In FIG. 11, an inspection apparatus 100 for inspecting a pattern formed on the substrate is an example of a multi electron beam inspection apparatus. The inspection apparatus 100 includes an image acquisition mechanism 150 and a control system circuit 160. The image acquisition mechanism 150 includes an electron beam column 102 (electron optical column) and an inspection chamber 103. In the electron beam column 102, there are disposed an electron gun 201, an electromagnetic lens 202, a shaping aperture array substrate 203, an electromagnetic lens 205, a multipole aberration corrector 220, a bundle blanking deflector 212, a limiting aperture substrate 213, an electromagnetic lens 206, an electromagnetic lens 207 (objective lens), a main deflector 208, a sub deflector 209, a beam separator 214, a deflector 218, an electromagnetic lens 224, and a multi-detector 222. A primary electron optical system is composed of the electron gun 201, the electromagnetic lens 202, the shaping aperture array substrate 203, the electromagnetic lens 205, the multipole aberration corrector 220, the bundle blanking deflector 212, the limiting aperture substrate 213, the electromagnetic lens 206, the electromagnetic lens 207 (objective lens), the main deflector 208, and the sub deflector 209. A secondary electron optical system is composed of the electromagnetic lens 207, the beam separator 214, the deflector 218, and the electromagnetic lens 224.

In the inspection chamber 103, there is disposed a stage 105 movable at least in the x and y directions. A substrate 101 (target object) to be a target of pattern inspection is mounted on the stage 105. The substrate 101 may be an exposure mask substrate, or a semiconductor substrate such as a silicon wafer. In the case of the substrate 101 being a semiconductor substrate, a plurality of chip patterns (wafer dies) are formed on the semiconductor substrate. In the case of the substrate 101 being an exposure mask substrate, a chip pattern is formed on the exposure mask substrate. The chip pattern is composed of a plurality of figure patterns. When the chip pattern formed on the exposure mask substrate is exposed/transferred onto the semiconductor substrate a plurality of times, a plurality of chip patterns (wafer dies) are formed on the semiconductor substrate. The case of the substrate 101 being a semiconductor substrate is mainly described below. The substrate 101 is placed with its pattern-forming surface facing upward on the stage 105, for example. Further, on the stage 105, there is disposed a mirror 216 which reflects a laser beam for measuring a laser length emitted from a laser length measuring system 122 arranged outside the inspection chamber 103. The multi-detector 222 is connected, at the outside of the electron beam column 102, to a detection circuit 106. The detection circuit 106 is connected to a chip pattern memory 123.

In the control system circuit 160, a control computer 110 which controls the whole of the inspection apparatus 100 is connected, through a bus 120, to a position circuit 107, a comparison circuit 108, a reference image generation circuit 112, a stage control circuit 114, an aberration correction circuit 121, a lens control circuit 124, a blanking control circuit 126, a deflection control circuit 128, a storage device 109 such as a magnetic disk drive, a monitor 117, a memory 118, and a printer 119. The deflection control circuit 128 is connected to DAC (digital-to-analog conversion) amplifiers 144, 146 and 148. The DAC amplifier 146 is connected to the main deflector 208, and the DAC amplifier 144 is connected to the sub deflector 209. The DAC amplifier 148 is connected to the deflector 218.

The chip pattern memory 123 is connected to the comparison circuit 108. The stage 105 is driven by a drive mechanism 142 under the control of the stage control circuit 114. In the drive mechanism 142, for example, a drive system such as a three (x-, y-, and θ-) axis motor which provides drive in the directions of x, y, and θ in the stage coordinate system is configured, and the stage 105 can move in the x, y, and θ directions. A step motor, for example, can be used as each of these x, y, and θ motors (not shown). The stage 105 is movable in the horizontal direction and the rotation direction by the x-, y-, and θ-axis motors. The movement position of the stage 105 is measured by the laser length measuring system 122, and supplied to the position circuit 107. Based on the principle of laser interferometry, the laser length measuring system 122 measures the position of the stage 105 by receiving a reflected light from the mirror 216. In the stage coordinate system, the x, y, and θ directions are set, for example, with respect to a plane perpendicular to the optical axis of multiple primary electron beams 301.

The electromagnetic lenses 202, 205, 206, 207 (objective lens), and 224, and the beam separator 214 are controlled by the lens control circuit 124. The bundle blanking deflector 212 is composed of two or more electrodes, and each electrode is controlled by the blanking control circuit 126 through a DAC amplifier (not shown). The multipole aberration corrector 220 is controlled by the aberration correction circuit 121. The sub deflector 209 is composed of four or more electrodes, and each electrode is controlled by the deflection control circuit 128 through the DAC amplifier 144. The main deflector 208 is composed of four or more electrodes, and each electrode is controlled by the deflection control circuit 128 through the DAC amplifier 146. The deflector 218 is composed of four or more electrodes, and each electrode is controlled by the deflection control circuit 128 through the DAC amplifier 148.

To the electron gun 201, there is connected a high voltage power supply circuit (not shown). The high voltage power supply circuit applies an acceleration voltage between a filament (cathode) and an extraction electrode (anode) (which are not shown) in the electron gun 201. In addition to the applying the acceleration voltage, a voltage is applied to another extraction electrode (Wehnelt), and the cathode is heated to a predetermined temperature, and thereby, electrons from the cathode are accelerated to be emitted as an electron beam 200.

FIG. 11 shows a configuration necessary for describing the embodiment 1. Other configuration generally necessary for the inspection apparatus 100 may also be included therein.

Next, operations of the image acquisition mechanism 150 in the inspection apparatus 100 will be described below.

The electron beam 200 emitted from the electron gun 201 (emission source) is refracted by the electromagnetic lens 202, and illuminates the whole of the shaping aperture array substrate 203. A plurality of quadrangular or circular holes (openings) two-dimensionally arrayed are formed in the shaping aperture array substrate 203. The region including all the plurality of holes is irradiated by the electron beam 200. The multiple primary electron beams 301 (charge particle beam to be corrected) are formed by letting portions of the electron beam 200, which irradiate the positions of the plurality of holes, individually pass through respective plurality of holes in the shaping aperture array substrate 203.

The formed multiple primary electron beams 301 are individually refracted by the electromagnetic lenses 205 and 206, and travel to the electromagnetic lens 207 (objective lens) while repeating forming an intermediate image and a crossover through the beam separator 214 disposed at the crossover position of each beam of the multiple primary electron beams 301. Meanwhile, the multipole aberration corrector 220 corrects aberration such as an astigmatism and/or distortion aberration (distortion) of the multiple primary electron beams 301 (charged particle beam to be corrected). FIG. 11 shows the case where the multipole aberration corrector 220 is arranged in the magnetic field of the electromagnetic lens 205. By arranging it in the magnetic field of the electromagnetic lens 205, the electric potential to be applied to the control electrode of the multipole aberration corrector 220 can be low compared with that in the case of arranging it outside the magnetic field. For example, it can be reduced to about 1/100. However, it is not limited thereto. The multipole aberration corrector 220 should be arranged between the shaping aperture array substrate 203 and the beam separator 214.

When the multiple primary electron beams 301 are incident on the electromagnetic lens 207 (objective lens), the electromagnetic lens 207 focuses the multiple primary electron beams 301 onto the substrate 101. In other words, the electromagnetic lens 207 (an example of electron optical system) leads the multiple primary electron beams 301, whose at least one of an astigmatism and an aberration distortion has been corrected by the multipole aberration corrector 220, to the substrate 101. The multiple primary electron beams 301 having been focused on the substrate 101 (target object) by the electromagnetic lens (objective lens) 207 are collectively deflected by the main deflector 208 and the sub deflector 209 so as to irradiate respective beam irradiation positions on the substrate 101. When all of the multiple primary electron beams 301 are collectively deflected by the bundle blanking deflector 212, they deviate from the hole in the center of the limiting aperture substrate 213 and are blocked by the limiting aperture substrate 213. On the other hand, the multiple primary electron beams 301 which were not deflected by the bundle blanking deflector 212 pass through the hole in the center of the limiting aperture substrate 213 as shown in FIG. 11. Blanking control is provided by On/Off of the bundle blanking deflector 212, and thus On/Off of the beams is collectively controlled. Thus, the limiting aperture substrate 213 blocks the multiple primary electron beams 301 which were deflected to be in the "Off condition" by the bundle blanking deflector 212. Then, the multiple primary electron beams 301 for inspection (for image acquisition) are formed by beams having been made during a time from becoming "beam On" to becoming "beam Off" and having passed through the limiting aperture substrate 213.

When desired positions on the substrate 101 are irradiated with the multiple primary electron beams 301, a flux of secondary electrons (multiple secondary electron beams 300) including reflected electrons each corresponding to each of the multiple primary electron beams 301 is emitted from the substrate 101 due to the irradiation with the multiple primary electron beams 301.

The multiple secondary electron beams 300 emitted from the substrate 101 travel to the beam separator 214 through the electromagnetic lens 207.

The beam separator 214 generates an electric field and a magnetic field to be perpendicular to each other in a plane orthogonal to the traveling direction of the center beam (the trajectory center axis) of the multiple primary electron beams 301. The electric field exerts a force in a fixed direction regardless of the traveling direction of electrons. In contrast, the magnetic field exerts a force according to Fleming's left-hand rule. Therefore, the direction of force acting on electrons can be changed depending on the entering direction of the electrons. With respect to the multiple primary electron beams 301 entering the beam separator 214 from the upper side, since the force due to the electric field and the force due to the magnetic field cancel each other out, the beams 301 travel straight downward. In contrast, with respect to the multiple secondary electron beams 300 entering the beam separator 214 from the lower side, since both the force due to the electric field and the force due to the magnetic field are exerted in the same direction, the beams 300 are bent obliquely upward, and separated from the multiple primary electron beams 301.

The multiple secondary electron beams 300 bent obliquely upward and separated from the multiple primary electron beams 301 are further bent by the deflector 218, and projected, while being refracted, onto the multi-detector 222 by the electromagnetic lens 224. The multi-detector 222 detects the projected multiple secondary electron beams 300. The multi-detector 222 includes, for example, a diode type two-dimensional sensor (not shown). Then, at the position of the diode type two-dimensional sensor corresponding to each beam of the multiple primary electron beams 301, each secondary electron of the multiple secondary electron beams 300 collides with the diode type two-dimensional sensor, so that electrons are generated and secondary electron image data is produced for each pixel. An intensity signal detected by the multi-detector 222 is output to the detection circuit 106.

Figure 12A:
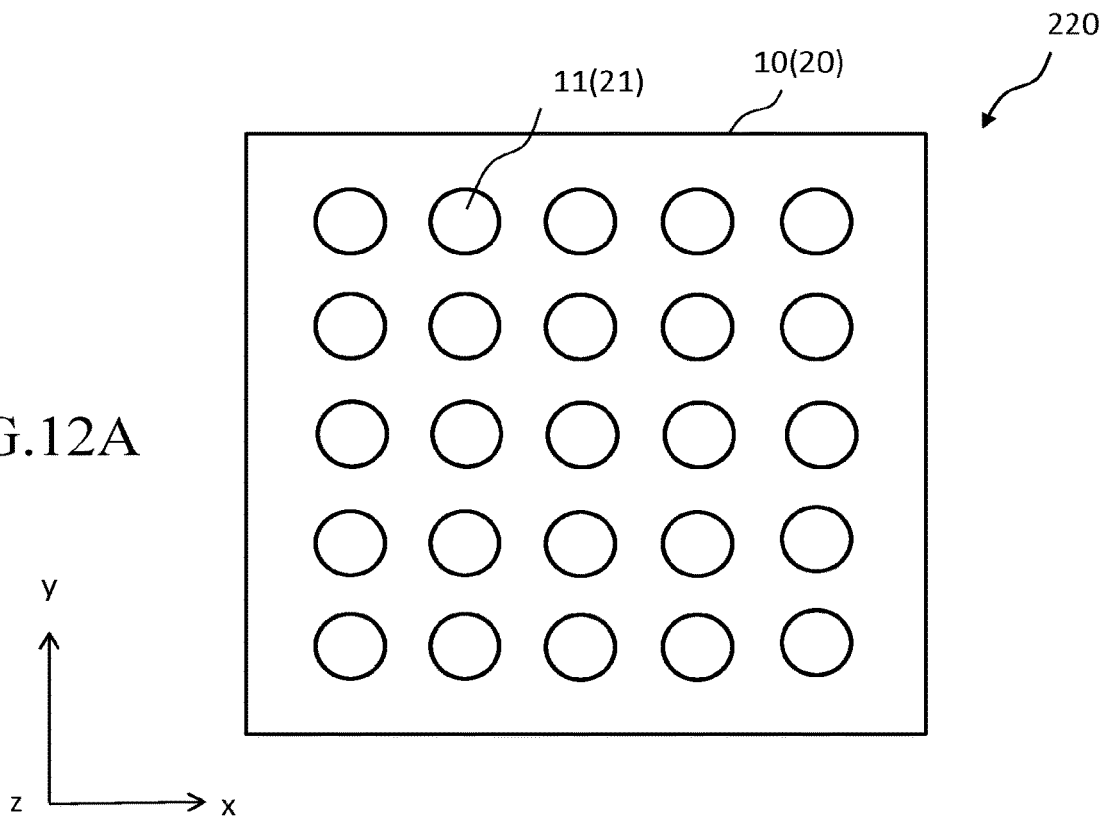
FIGS. 12A and 12B are a top view showing an example of a configuration of each electrode substrate of a multipole aberration corrector according to the embodiment 1.
Figure 12B:
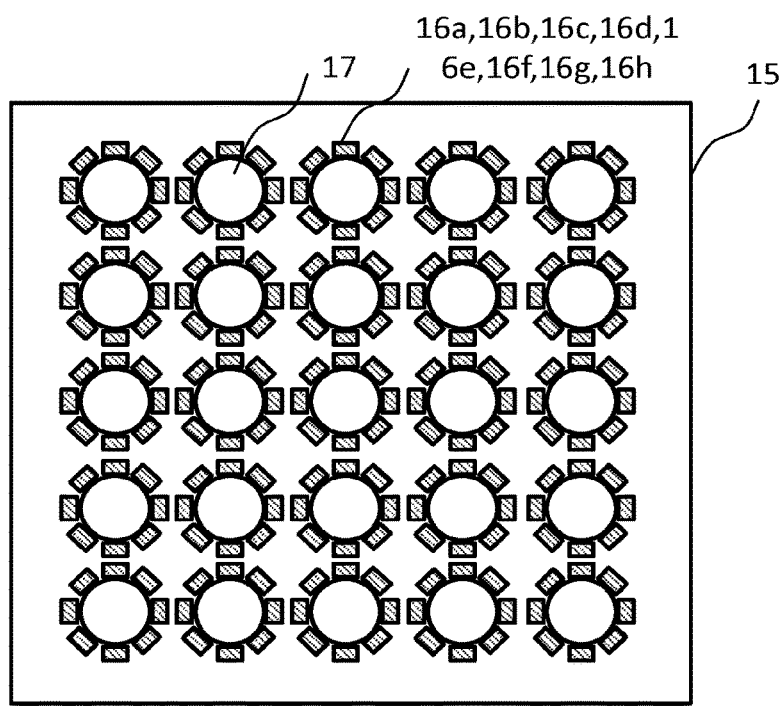

FIG. 12 (FIGS. 12A and 12B) is a top view showing an example of a configuration of each electrode substrate of the multipole aberration corrector 220 according to the embodiment 1. The examples of FIGS. 12A and 12B show the case where 5×5 multiple primary electron beams 301 are used. FIG. 12A shows the electrode substrate of the upper stage and the lower stage. FIG. 12B shows the electrode substrate of the middle stage. In the example of FIG. 12B, the wirings 18 connected to each of the control electrodes 16a to 16h and the terminal 19 are not shown.

FIG. 13 (FIGS. 13A and 13B) shows an example of distortion aberration (distortion) according to the embodiment 1. In the case of FIGS. 13A and 13B, 5×5 multiple primary electron beams 301 are used. If a plurality of holes are formed in a matrix in the x and y directions at a predetermined pitch in the shaping aperture array substrate 203, ideally, as shown in FIG. 13B, irradiation positions 19 of the multiple primary electron beams 301 on the substrate 101 should also be arranged in a matrix with a predetermined reduction ratio. However, due to the usage of the electron optical system of electromagnetic lenses, etc., distortion (distortion aberration) occurs as shown in FIG. 13A. With respect to the shape of the distortion, it depends on conditions and represents a distribution called a barrel type or a pincushion type. Generally, distortion of a magnetic lens shifts not only in the radial direction but also in the rotational direction. FIG. 13A shows the case under conditions of not generating rotational components. Even if a certain amount of tendency exists in the direction of distortion and the amount of position deviation generated in the multiple primary electron beams 301, it differs for each beam. Therefore, in order to correct such distortion, it is necessary to perform correction for each individual beam. By correcting the beam trajectory, for each beam, by using the multipole aberration corrector 220 according to the embodiment 1, the irradiation positions 19 of the multiple primary electron beams 301 on the substrate 101 can be corrected as shown in FIG. 13B.

Figure 14A:
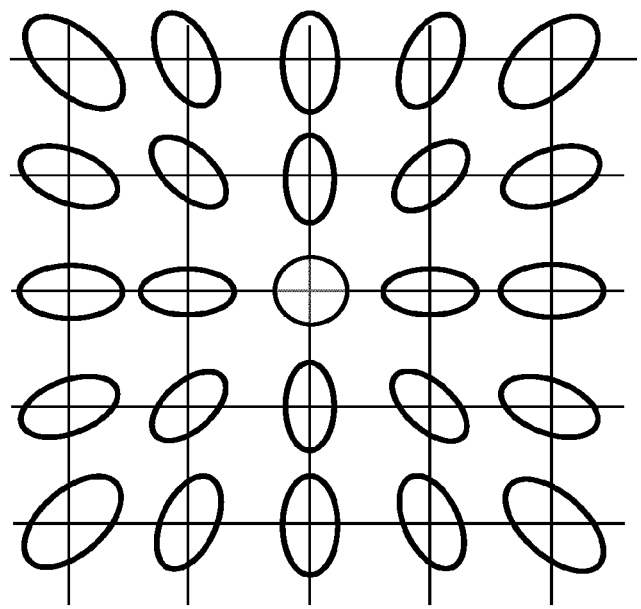
FIGS. 14A and 14B show an example of astigmatism according to the embodiment 1.
Figure 14B:
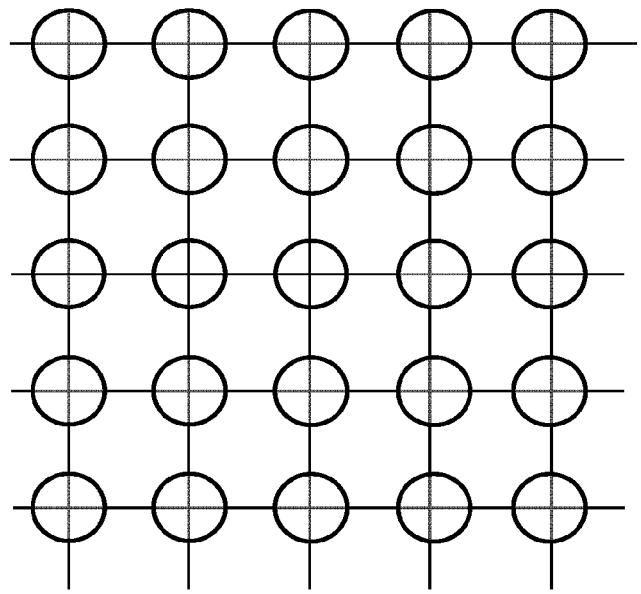
Figure 15A:
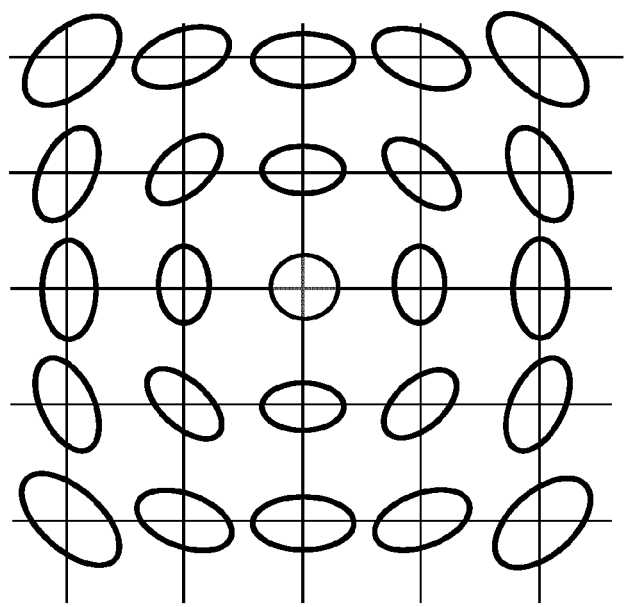
FIGS. 15A and 15B show another example of astigmatism according to the embodiment 1.
Figure 15A:
Figure 15B:
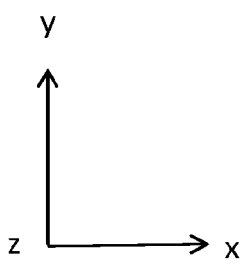
Figure 15B:
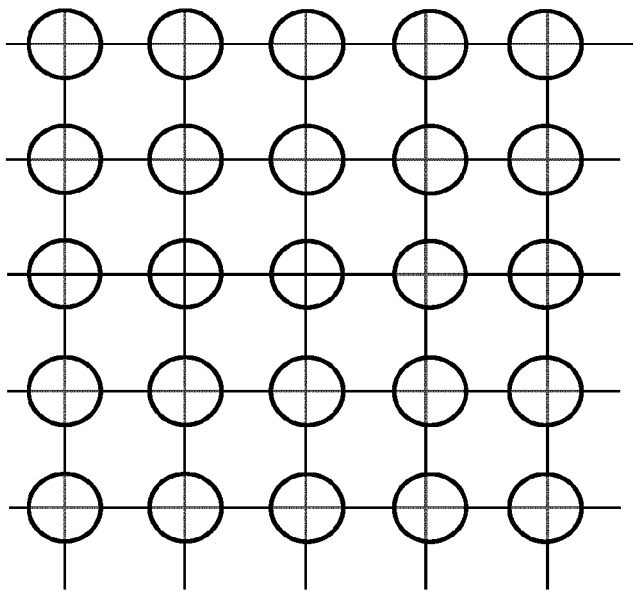

FIG. 14 (FIGS. 14A and 14B) shows an example of astigmatism according to the embodiment 1. In the case of FIGS. 14A and 14B, 5×5 multiple primary electron beams 301 whose each section is circular are used. As shown in FIG. 14B, ideally, the shape of irradiation with each beam is circular. However, due to usage of the electron optical system of electromagnetic lenses and the like, astigmatism occurs as shown in FIG. 14A. Therefore, as shown in FIG. 14A, the focus position deviates in the two-dimensional x and y directions on the substrate 101 (target object), which makes the beam a so-called elliptic form at the focus position, and thus, blur occurs in the irradiating beam. Although the direction of astigmatism and the amount of position deviation generated in the multiple primary electron beams 301 tend to become an elliptic form extending radially from the center of the multiple primary electron beams 301, it differs for each beam. Therefore, in order to correct such astigmatism, it is necessary to perform correction for each individual beam. Then, by correcting the beam trajectory of each beam by using the multipole aberration corrector 220 according to the embodiment 1, the astigmatism can be corrected as shown in FIG. 14B.

FIG. 15 (FIGS. 15A and 15B) shows another example of astigmatism according to the embodiment 1. The direction of the astigmatism occurring in the multiple primary electron beams 301 is not limited to the case of extending radially from the center of the multiple primary electron beams 301 as shown in FIG. 14A. It may extend in the circumferential direction as shown in FIG. 15A. Also in that case, the astigmatism can be similarly corrected as shown in FIG. 15B by correcting the beam trajectory of each beam by using the multipole aberration corrector 220 according to the embodiment 1.

Moreover, the multipole aberration corrector 220 according to the embodiment 1 can correct distortion and astigmatism simultaneously since the electric potential to be applied to each control electrode 16 used as multipole can be set individually.

Figure 16:
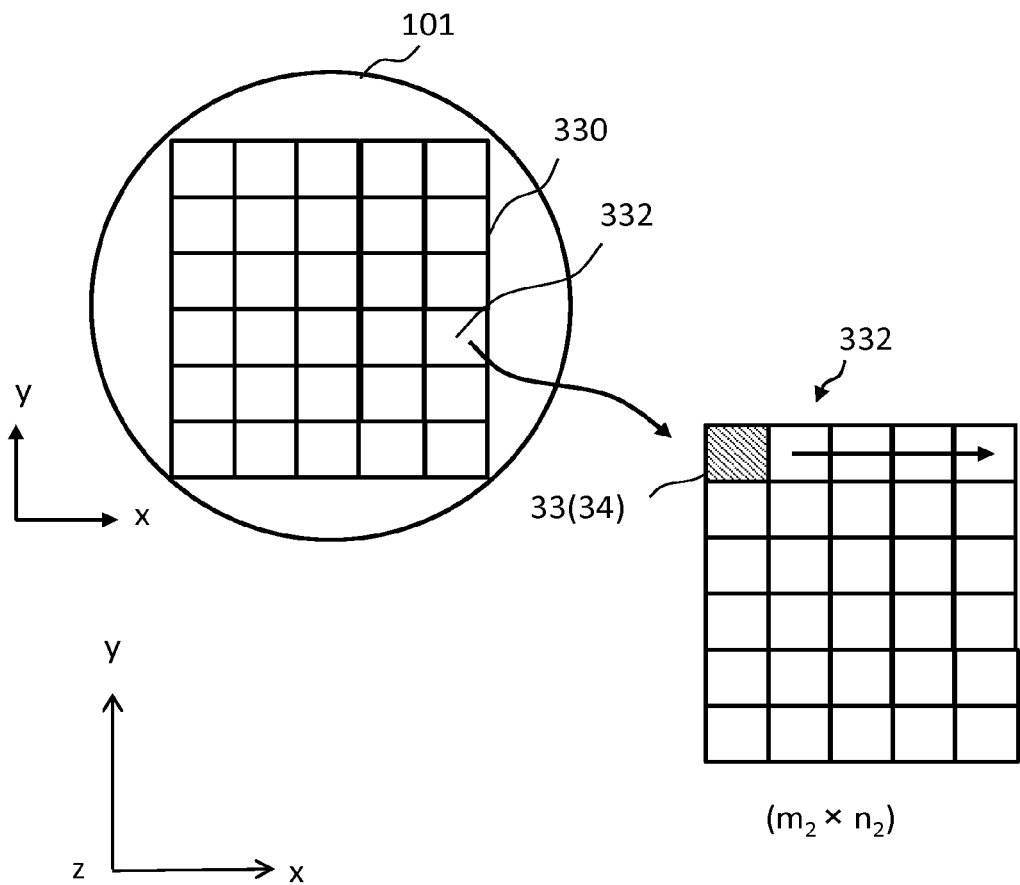
FIG. 16 shows an example of a plurality of chip regions formed on a semiconductor substrate according to the embodiment 1.

The image acquisition mechanism 150 acquires a secondary electron image of a pattern formed on the substrate 101, using the multiple primary electron beams 301 whose at least one of astigmatism and distortion aberration has been corrected by the multipole aberration corrector 220. Specifically, it operates as follows:

FIG. 16 shows an example of a plurality of chip regions formed on a semiconductor substrate, according to the embodiment 1. In FIG. 16, in the case of the substrate 101 being a semiconductor substrate (wafer), a plurality of chips (wafer dies) 332 in a two-dimensional array are formed in an inspection region 330 of the semiconductor substrate (wafer). A mask pattern for one chip formed on an exposure mask substrate has been reduced to, for example, ¼, and exposed/transferred onto each chip 332 by an exposure device (stepper) (not shown). The inside of each chip 332 is divided into a plurality of mask dies 33 two-dimensionally arrayed in $m_2$ columns wide (the x direction) and $n_2$ rows long (the y direction) (each of $m_2$ and $n_2$ is an integer of 2 or more), for example. In the embodiment 1, the mask die 33 serves as a unit inspection region. Movement of the beams to a target mask die 33 is achieved by collectively deflecting all of the multiple primary electron beams 301 by the main deflector 208.

Figure 17:
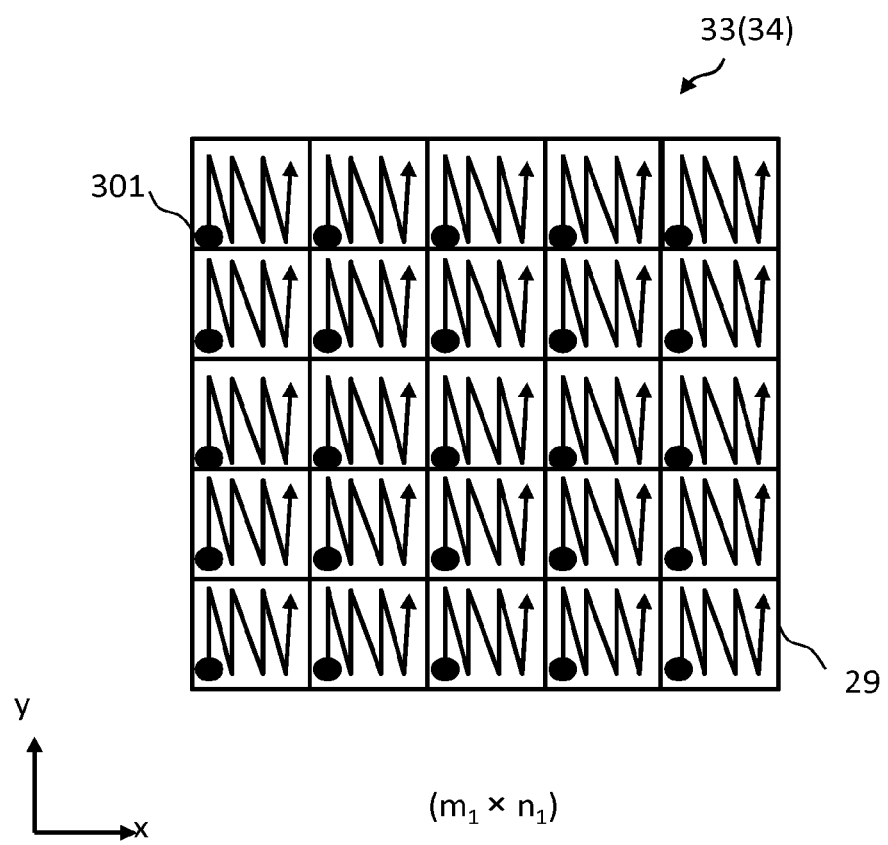
FIG. 17 illustrates a scan operation of multiple beams according to the embodiment 1.

FIG. 17 illustrates a scanning operation with multiple beams according to the embodiment 1. In the example of FIG. 17, multiple primary electron beams 301 of 5×5 (rows by columns) are shown. An irradiation region 34 that can be irradiated by one irradiation with the multiple primary electron beams 301 is defined by (x direction size obtained by multiplying a beam pitch in the x direction of the multiple primary electron beams 301 on the substrate 101 by the number of beams in the x direction)×(y direction size obtained by multiplying a beam pitch in the y direction of the multiple primary electron beams 301 on the substrate 101 by the number of beams in the y direction). In the case of FIG. 15, the irradiation region 34 and the mask die 33 are of the same size. However, it is not limited thereto. The irradiation region 34 may be smaller than the mask die 33, or larger than it. Each beam of the multiple primary electron beams 301 scans (scanning operation) the inside of a sub-irradiation region 29 which is surrounded by the beam pitch in the x direction and the beam pitch in the y direction and in which the beam concerned itself is located. Each beam of the multiple primary electron beams 301 is associated with anyone of the sub-irradiation regions 29 which are different from each other. At the time of each shot, each beam is applied to the same position in the associated sub-irradiation region 29. The beam is moved in the sub-irradiation region 29 by collective deflection of all of the multiple primary electron beams 301 by the sub deflector 209. By repeating this operation, one beam irradiates, in order, all in one sub-irradiation region 29.

The multiple secondary electron beams 300 corresponding to the multiple primary electron beams 301 and including reflected electrons are emitted from the substrate 101 because desired positions on the substrate 101 are irradiated with the multiple primary electron beams 301 whose aberration has been corrected by the multipole aberration corrector 220. The multiple secondary electron beams 300 emitted from the substrate 101 travel to the beam separator 214, and are bent obliquely upward. The trajectory of the multiple secondary electron beams 300 having been bent obliquely upward is bent by the deflector 218, and projected on the multi-detector 222. Thus, the multi-detector 222 detects the multiple secondary electron beams 300 emitted because the substrate 101 surface is irradiated with the multiple primary electron beams 301. Reflected electrons may be emitted in the middle of the optical path.

As described above, the whole of the multiple primary electron beams 301 scans the mask die 33 as the irradiation region 34, and each beam individually scans one corresponding sub-irradiation region 29. Then, after scanning one mask die 33, the irradiation region 34 is moved to a next adjacent mask die 33 to be scanned. This operation is repeated to proceed scanning of each chip 332. Due to shots of the multiple primary electron beams 301, secondary electrons are emitted from the irradiated positions at each shot time, and detected by the multi-detector 222.

As described above, using the multiple primary electron beams 301, the image acquisition mechanism 150 scans the substrate 101 to be inspected on which a figure pattern has been formed, and detects the multiple secondary electron beams 300 emitted from the inspection substrate 101 by irradiation with the multiple primary electron beams 301. Detected data (measured image: secondary electron image: image to be inspected) on a secondary electron from each measurement pixel 36 detected by the multi-detector 222 is output to the detection circuit 106 in order of measurement. In the detection circuit 106, the detected data in analog form is converted into digital data by an A-D converter (not shown), and stored in the chip pattern memory 123. Thus, the image acquisition mechanism 150 acquires a measured image of a pattern formed on the substrate 101. Then, for example, when the detected data for one chip 332 has been accumulated, the accumulated data is transmitted as chip pattern data to the comparison circuit 108, together with information on each position from the position circuit 107.

In a reference image generating step, the reference image generation circuit 112 (reference image generation unit) generates a reference image corresponding to an image to be inspected. The reference image generation circuit 112 generates a reference image, for each frame region, based on design data serving as a basis for forming a pattern on the substrate 101, or on design pattern data defined in exposure image data of a pattern formed on the substrate 101. Preferably, for example, the mask die 33 is used as the frame region. Specifically, it operates as follows: First, design pattern data is read from the storage device 109 through the control computer 110, and each figure pattern defined by the read design pattern data is converted into image data of binary or multiple values.

Here, figures defined by the design pattern data are, for example, rectangles and triangles as basic figures. For example, there is stored figure data defining the shape, size, position, and the like of each pattern figure by using information, such as coordinates (x, y) of the reference position of the figure, lengths of sides of the figure, and a figure code serving as an identifier for identifying the figure type such as rectangles, triangles and the like.

When the design pattern data used as the figure data is input to the reference image generation circuit 112, the data is developed into data of each figure. Then, the figure code, figure dimensions, and the like indicating the figure shape in the figure data are interpreted. Then, it is developed to design pattern image data of binary or multiple values as a pattern to be arranged in squares in units of grids of predetermined quantization dimensions, and then is output. In other words, the design data is read, the occupancy of a figure in the design pattern is calculated for each square region obtained by virtually dividing the inspection region into squares in units of predetermined dimensions, and n-bit occupancy data is output. For example, it is preferable to set one square as one pixel. Assuming that one pixel has a resolution of $1/2^8 (=1/256)$, the occupancy rate in each pixel is calculated by allocating sub regions each being $1/256$ to the region of a figure arranged in the pixel. Then, 8-bit occupancy data is output to the reference image generation circuit 112. Such square regions (inspection pixels) may be corresponding to pixels of measured data.

Next, the reference image generation circuit 112 performs appropriate filter processing on design image data of a design pattern which is image data of a figure. Since optical image data as a measured image is in the state affected by filtering performed by the optical system, in other words, in an analog state continuously changing, it is possible to match the design image data with the measured data by also applying filtering processing to the design image data being design side image data whose image intensity (gray scale level) is represented by digital values. The generated image data of a reference image is output to the comparison circuit 108.

Figure 18:
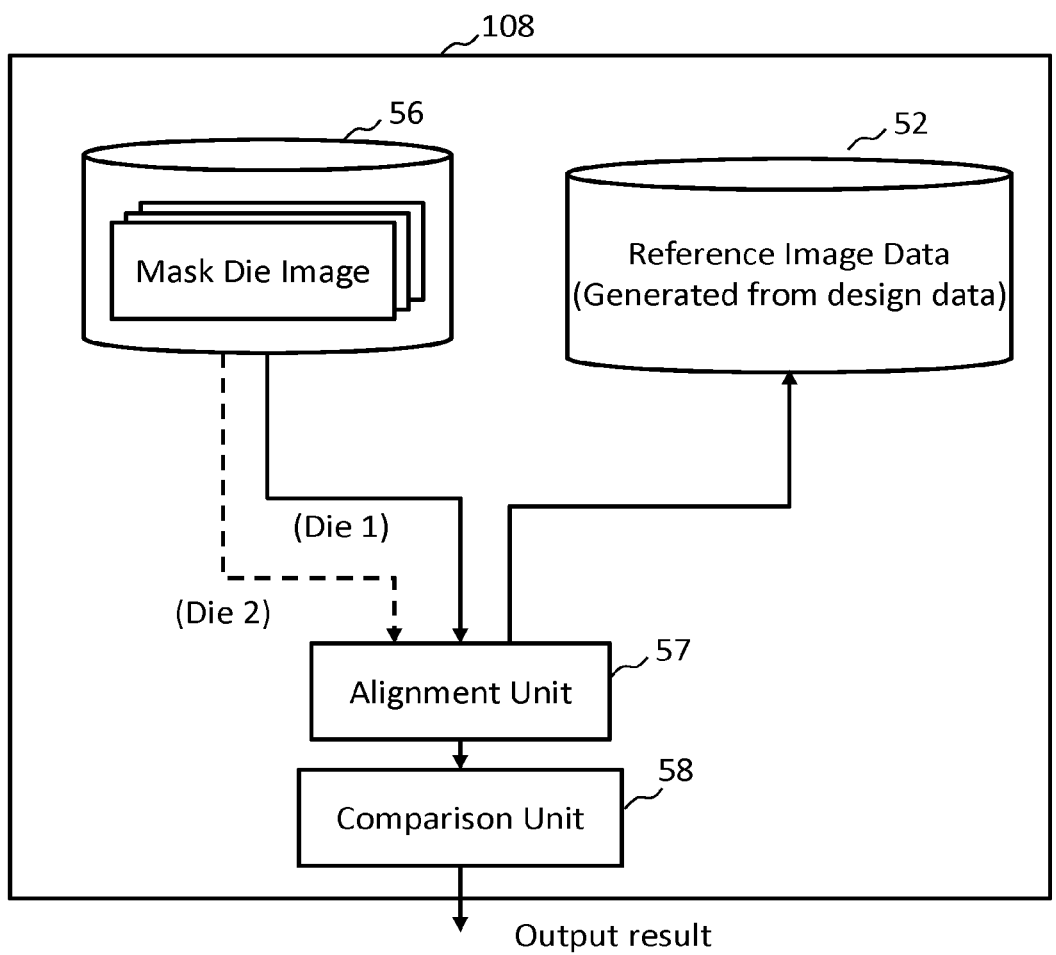
FIG. 18 is a block diagram showing an example of a configuration in a comparison circuit according to the embodiment 1.

FIG. 18 shows an example of a configuration in a comparison circuit according to the embodiment 1. In FIG. 18, storage devices 52 and 56, such as magnetic disk drives, an alignment unit 57, and a comparison unit 58 are arranged in the comparison circuit 108. Each of the "units" such as the alignment unit 57 and the comparison unit 58 includes processing circuitry, which includes an electric circuit, a computer, a processor, a circuit board, a quantum circuit, a semiconductor device, or the like. Further, common processing circuitry (the same processing circuitry), or different processing circuitry (separate processing circuitry) may be used for each of the "units". Input data required in the alignment unit 57 and the comparison unit 58, and calculated results are stored in a memory (not shown) or in the memory 118 each time.

In the comparison circuit 108, transmitted pattern image data (secondary electron image data) is temporarily stored in the storage device 56. Further, transmitted reference image data is temporarily stored in the storage device 52.

In an aligning step, the alignment unit 57 reads a mask die image serving as an image to be inspected, and a reference image corresponding to the mask die image, and provides alignment between both the images based on units of sub-pixels smaller than pixels. For example, the alignment can be performed by a least-square method.

In a comparing step, the comparison unit 58 compares the mask die image (image to be inspected) and the reference imaged. The comparison unit 58 compares them, for each pixel, based on predetermined determination conditions in order to determine whether there is a defect such as a shape defect. For example, if a gray scale level difference of each pixel is larger than a determination threshold Th, it is determined that there is a defect. Then, the comparison result is output. It may be output to the storage device 109, the monitor 117, or the memory 118, or alternatively, output from the printer 119.

Not being limited to the die-to-database inspection described above, the die-to-die inspection may also be performed. In the case of conducting the die-to-die inspection, images of the mask dies 33 with identical patterns formed thereon are compared. Accordingly, a mask die image of a partial region of the chip 332 serving as a die (1), and a mask die image of a corresponding region of another chip 332 serving as a die (2) are used. Alternatively, a mask die image of a partial region of the chip 332 serving as a die (1), and a mask die image of another partial region of the same chip 332 serving as a die (2), where identical patterns are formed, may be compared. In such a case, if one of the images of the mask dies 33 on which identical patterns are formed is used as a reference image, inspection can be performed by the same method as that of the die-to-database inspection described above.

Thus, in the aligning step, the alignment unit 57 reads the mask die image of the die (1) and the mask die image of the die (2), and provides alignment between both the images based on units of sub-pixels smaller than pixels. For example, the alignment can be performed by a least-square method.

Then, in the comparing step, the comparison unit 58 compares the mask die image of the die (1) and the mask die image of the die (2). The comparison unit 58 compares them, for each pixel, based on predetermined determination conditions in order to determine whether there is a defect such as a shape defect. For example, if a gray scale level difference of each pixel is larger than the determination threshold Th, it is determined that there is a defect. Then, the comparison result is output. It may be output to a storage device, monitor, or memory (which are not shown), or alternatively, may be output from a printer.

As described above, according to the embodiment 1, even when the opening between multiple poles is small, a conduction inspection can be performed for the multipole aberration corrector 220. Therefore, it is possible to execute a conduction inspection of the multipole aberration corrector 220 before mounting it on a multiple beam irradiation apparatus such as an inspection apparatus for which an aberration correction is to be needed. Thus, since it is possible to deliver irradiation of the multiple primary electron beams 301 whose aberration has been corrected to the substrate 101, highly accurate images can be obtained and highly accurate pattern inspection can be carried out.

In the above description, a series of circuits " . . . " includes processing circuitry, which includes an electric circuit, a computer, a processor, a circuit board, a quantum circuit, a semiconductor device, or the like. Further, common processing circuitry (the same processing circuitry), or different processing circuitry (separate processing circuitry) may be used for each "circuit". A program for causing a processor, etc. to execute processing may be stored in a recording medium, such as a magnetic disk drive, magnetic tape drive, FD, ROM (Read Only Memory), or the like. For example, the position circuit 107, the comparison circuit 108, the reference image generation circuit 112, the stage control circuit 114, the aberration correction circuit 121, the lens control circuit 124, the blanking control circuit 126, and the deflection control circuit 128 may be configured by at least one processing circuit described above.

Embodiments have been explained referring to specific examples described above. However, the present invention is not limited to these specific examples. Although FIG. 1 shows the case where the multiple primary electron beams 301 are formed by the shaping aperture array substrate 203 irradiated with one beam from the electron gun 201 serving as an irradiation source, it is not limited thereto. The multiple primary electron beams 301 may be formed by irradiation with a primary electron beam from each of a plurality of irradiation sources.

While the apparatus configuration, control method, and the like not directly necessary for explaining the present invention are not described, they can be appropriately selected and used when needed.

Further, any other conduction inspection method for a multipole aberration corrector, conduction inspection apparatus for a multipole aberration corrector, and multiple electron beam irradiation apparatus on which a multipole aberration corrector is mounted that include elements of the present invention and that can be appropriately modified by those skilled in the art are included within the scope of the present invention.

INDUSTRIAL APPLICABILITY

The present invention relates to a conduction inspection method for a multipole aberration corrector and a conduction inspection apparatus for a multipole aberration corrector, and can be used, for example, for a conduction inspection method for a multipole aberration corrector, which corrects aberration of multiple beams, mounted on an apparatus which applies irradiation of electron multiple beams.

REFERENCE SIGNS LIST

9 Irradiation position
10 Upper-stage substrate
11, 17, 21 Opening
15 Middle-stage substrate
16 Control electrode
18 Wiring
19 Terminal
20 Lower-stage substrate
29 Sub-irradiation region
33 Mask die
34 Irradiation region
52, 56, 109, 540 Storage device
57 Alignment unit
58 Comparison unit
100 Inspection apparatus
101 Substrate
102, 502 Electron beam column
103, 503 Inspection chamber
105, 505 Stage
106 Detection circuit
107 Position circuit
108 Comparison circuit
110, 510 Control computer
112 Reference image generation circuit
114 Stage control circuit
117 Monitor
118, 511 Memory
119 Printer
120 Bus
121 Aberration correction circuit
122 Laser length measuring system
123 Chip pattern memory
124 Lens control circuit
126 Blanking control circuit
128 Deflection control circuit
142 Drive mechanism
144, 146, 148 DAC amplifier
150 Image acquisition mechanism
160, 560 Control system circuit
200, 504 Electron beam
201, 501 Electron gun
202, 205, 206, 207, 224, 512 Electromagnetic lens
203 Shaping aperture array substrate
208 Main deflector
209 Sub deflector
212 Bundle blanking deflector
213 Limiting aperture substrate
214 Beam separator
216 Mirror
218, 514 Deflector
220 Multipole aberration corrector
221 Reflector
222 Multi-detector
300 Multiple secondary electron beams
301 Multiple primary electron beams
330 Inspection region
332 Chip
500 Conduction inspection apparatus
506 Electron
518 Support table
520 Inflow electron dosimeter
523 Support pin
532 Selection unit
534 Inspection control unit
536, 538 Determination unit
542 Control circuit
550 Inspection mechanism

The invention claimed is:

1. A conduction inspection method for a multipole aberration corrector comprising:
applying, in a state where a predetermined potential has been applied to each shield electrode, an inspection charged particle beam to pass through a first opening, a second opening, and a third opening, using a multipole aberration corrector which includes an upper-stage substrate where the first opening is formed and a shield electrode is arranged around the first opening, a middle-stage substrate where the second opening is formed, a plurality of control electrodes are disposed to be opposite each other across the second opening, and a plurality of wirings are arranged to be individually connected to one of the plurality of control electrodes which are different from each other, and a lower-stage substrate where the third opening is formed and a shield electrode is arranged around the third opening, and which corrects aberration of a correction charged particle beam passing through the first opening, the second opening, and the third opening by individually variably applying a potential to each of the plurality of control electrodes;

measuring, via a wiring individually connected to each control electrode of the plurality of control electrodes in the plurality of wirings, an inflow electron dose of electrons, into the each control electrode of the plurality of control electrodes, which are secondarily emitted because the inspection charged particle beam has passed through the first opening, the second opening, and the third opening and has irradiated an object disposed at a downstream side of the lower-stage substrate; and determining individually, for the each control electrode, whether there is conduction between a control electrode concerned and a wiring connected to the control electrode concerned, based on a result of measuring the inflow electron dose into the each control electrode.

2. The conduction inspection method for the multipole aberration corrector according to claim 1, wherein, in the upper-stage substrate, a plurality of first openings including the first opening are formed and the shield electrode is disposed around the plurality of first openings, in the middle-stage substrate, a plurality of second openings including the second opening are formed, the plurality of control electrodes being opposite each other across the second opening are disposed for each second opening of the plurality of second openings, and a plurality of wirings individually connected to one of the plurality of control electrodes which are different from each other are arranged for each second opening of the plurality of second openings, in the lower-stage substrate, a plurality of third openings including the third opening are formed and the shield electrode is arranged around the plurality of the third openings, and the conduction inspection method for the multipole aberration corrector individually determines, with respect to the multipole aberration corrector which individually corrects aberration of multiple charged particle beams, to be corrected, passing through the plurality of first openings, the plurality of second openings, and the plurality of third openings by individually variably applying a potential to each of the plurality of control electrodes at the each second opening, whether there is, at the each control electrode of the plurality of control electrodes at the each second opening, conduction between the control electrode concerned and the wiring connected to the control electrode concerned.

3. The conduction inspection method for the multipole aberration corrector according to claim 1, wherein an electron beam is used as the inspection charged particle beam used for the conduction inspection method.

4. The conduction inspection method for the multipole aberration corrector according to claim 1, wherein the plurality of control electrodes are at least two poles.

5. The conduction inspection method for the multipole aberration corrector according to claim 1, wherein the plurality of control electrodes are eight poles.

6. A conduction inspection apparatus for a multipole aberration corrector comprising:

an emission source configured to emit an inspection charged particle beam;

a focusing mechanism configured to control a focus position of the inspection charged particle beam;

a deflector configured to deflect the inspection charged particle beam in order to control an irradiation position of the inspection charged particle beam;

a stage on which there are disposed a multipole aberration corrector which includes an upper-stage substrate where a first opening is formed and a shield electrode is arranged around the first opening, a middle-stage substrate where a second opening is formed, a plurality of control electrodes are disposed to be opposite each other across the second opening, and a plurality of wirings are arranged to be individually connected to one of the plurality of control electrodes which are different from each other, and a lower-stage substrate where a third opening is formed and a shield electrode is arranged around the third opening, and which corrects aberration of a correction charged particle beam passing through the first opening, the second opening, and the third opening by individually variably applying a potential to each of the plurality of control electrodes, and an object disposed at a downstream side of the lower-stage substrate and irradiated with the inspection charged particle beam having passed through the first opening, the second opening, and the third opening, and at least one inflow electron dosimeter connected to the plurality of wirings, wherein it is determined individually, for each control electrode, whether there is conduction between a control electrode concerned and a wiring connected to the control electrode concerned, based on a result of measuring by the at least one inflow electron dosimeter, via a wiring individually connected to the each control electrode in the plurality of wirings, an inflow electron dose of an electron, into the each control electrode of the plurality of control electrodes, which is secondarily emitted because the inspection charged particle beam has passed through the first opening, the second opening, and the third opening and has irradiated an object disposed at a downstream side of the lower-stage substrate.

7. The conduction inspection apparatus for the multipole aberration corrector according to claim 6, wherein, in the upper-stage substrate, a plurality of first openings including the first opening are formed and the shield electrode is disposed around the plurality of first openings, in the middle-stage substrate, a plurality of second openings including the second opening are formed, the plurality of control electrodes being opposite each other across the second opening are disposed for each second opening of the plurality of second openings, and a plurality of wirings individually connected to one of the plurality of control electrodes which are different from each other are arranged for each second opening of the plurality of second openings, in the lower-stage substrate, a plurality of third openings including the third opening are formed and the shield electrode is arranged around the plurality of the third openings, and the conduction inspection apparatus for the multipole aberration corrector individually determines, with respect to the multipole aberration corrector which individually corrects aberration of multiple charged particle beams, to be corrected, passing through the first opening, the second opening, and the third opening by individually variably applying a potential to each of the plurality of control electrodes at the each second opening, whether there is, at the each control electrode of the plurality of control electrodes at the each second opening, conduction between the control electrode concerned and the wiring connected to the control electrode concerned.

8. The conduction inspection apparatus for the multipole aberration corrector according to claim 6, wherein an electron beam is used as the inspection charged particle beam used for the conduction inspection apparatus.

9. The conduction inspection apparatus for the multipole aberration corrector according to claim 6, wherein the plurality of control electrodes are at least two poles.

10. The conduction inspection apparatus for the multipole aberration corrector according to claim 6, wherein the plurality of control electrodes are eight poles.

* * * * *